(12) United States Patent
Chen et al.

(10) Patent No.: US 10,847,411 B2
(45) Date of Patent: Nov. 24, 2020

(54) CONDUCTIVE FEATURE FORMATION AND STRUCTURE

(71) Applicant: Taiwan Semiconductor Manufacturing Co., Ltd., Hsinchu (TW)

(72) Inventors: Pin-Wen Chen, Keelung (TW); Chia-Han Lai, Zhubei (TW); Mei-Hui Fu, Hsinchu (TW); Min-Hsiu Hung, Tainan (TW); Ya-Yi Cheng, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/556,383

(22) Filed: Aug. 30, 2019

(65) Prior Publication Data

US 2019/0385904 A1 Dec. 19, 2019

Related U.S. Application Data

(62) Division of application No. 15/939,572, filed on Mar. 29, 2018.

(51) Int. Cl.
*H01L 21/768* (2006.01)
*H01L 23/522* (2006.01)
(Continued)

(52) U.S. Cl.
CPC .. *H01L 21/76802* (2013.01); *H01L 21/76843* (2013.01); *H01L 21/76852* (2013.01);
(Continued)

(58) Field of Classification Search
CPC ......... H01L 21/76802; H01L 21/76843; H01L 21/76879; H01L 23/5329; H01L 23/5226; H01L 21/76852; H01L 21/76224
See application file for complete search history.

(56) References Cited

U.S. PATENT DOCUMENTS 6,090,706 A * 7/2000 Telford .................. C23C 16/42
427/255.392
6,268,289 B1 * 7/2001 Chowdhury ........ H01L 21/2885
257/E21.175
(Continued)

FOREIGN PATENT DOCUMENTS

TW 200820419 A 5/2008
TW 201203389 A 1/2012
TW 201328408 A 7/2013

*Primary Examiner* — Mohammad M Hoque
(74) *Attorney, Agent, or Firm* — Slater Matsil, LLP

(57) ABSTRACT

Generally, the present disclosure provides example embodiments relating to conductive features, such as metal contacts, vias, lines, etc., and methods for forming those conductive features. In an embodiment, a structure includes a first dielectric layer over a substrate, a first conductive feature in the first dielectric layer, a second dielectric layer over the first dielectric layer, a second conductive feature in the second dielectric layer, and a blocking region disposed between the first conductive feature and the second conductive feature. The second conductive feature is disposed between and abutting a first sidewall of the second dielectric layer and a second sidewall of the second dielectric layer. The blocking region extends laterally at least from the first sidewall of the second dielectric layer to the second sidewall of the second dielectric layer.

20 Claims, 20 Drawing Sheets

(51) Int. Cl.
   *H01L 23/532*   (2006.01)
   *H01L 21/762*   (2006.01)
(52) U.S. Cl.
   CPC .... *H01L 21/76879* (2013.01); *H01L 23/5226* (2013.01); *H01L 23/5329* (2013.01); *H01L 21/76224* (2013.01)

(56) References Cited

U.S. PATENT DOCUMENTS

| | | | |
|---|---|---|---|
| 6,348,709 B1* | 2/2002 | Graettinger | H01L 21/28518 |
| | | | 257/310 |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,157,774 B1 | 12/2018 | Peters et al. | |
| 2002/0072209 A1* | 6/2002 | Tseng | H01L 21/28061 |
| | | | 438/592 |
| 2006/0030094 A1 | 2/2006 | Chui et al. | |
| 2007/0190763 A1* | 8/2007 | Fujimoto | H01L 21/28518 |
| | | | 438/583 |
| 2007/0257323 A1* | 11/2007 | Tsui | H01L 23/485 |
| | | | 257/382 |
| 2008/0132023 A1* | 6/2008 | Chen | H01L 21/26506 |
| | | | 438/306 |
| 2008/0277736 A1 | 11/2008 | Nakajima | |
| 2008/0277742 A1* | 11/2008 | Hokazono | H01L 29/665 |
| | | | 257/401 |
| 2009/0008750 A1* | 1/2009 | Tokitoh | H01L 23/562 |
| | | | 257/629 |
| 2009/0159978 A1 | 6/2009 | Matsubara et al. | |
| 2010/0155949 A1* | 6/2010 | Jain | H01L 24/03 |
| | | | 257/751 |
| 2010/0291765 A1* | 11/2010 | Nakajima | H01L 21/28079 |
| | | | 438/592 |
| 2011/0062502 A1* | 3/2011 | Yin | H01L 21/76816 |
| | | | 257/288 |
| 2012/0225558 A1 | 9/2012 | Chang et al. | |
| 2013/0020623 A1* | 1/2013 | Tsui | H01L 27/11519 |
| | | | 257/300 |
| 2013/0154022 A1 | 6/2013 | Chung et al. | |
| 2014/0374814 A1 | 12/2014 | Wu et al. | |
| 2015/0024560 A1* | 1/2015 | Koehler | H01L 21/28176 |
| | | | 438/197 |
| 2015/0123118 A1* | 5/2015 | Yeom | H01L 29/45 |
| | | | 257/43 |
| 2015/0162414 A1* | 6/2015 | Boschke | H01L 29/4958 |
| | | | 257/411 |
| 2015/0364420 A1 | 12/2015 | Lin et al. | |
| 2016/0043035 A1* | 2/2016 | Lin | H01L 21/76802 |
| | | | 257/751 |
| 2016/0133721 A1* | 5/2016 | Cai | H01L 29/4958 |
| | | | 257/506 |
| 2016/0163815 A1* | 6/2016 | Hoentschel | H01L 29/665 |
| | | | 257/379 |
| 2016/0172456 A1 | 6/2016 | Li et al. | |
| 2017/0025312 A1 | 1/2017 | Kuo et al. | |
| 2018/0261604 A1* | 9/2018 | Woo | H01L 27/1104 |
| 2018/0286806 A1 | 10/2018 | Kim et al. | |

\* cited by examiner

CONDUCTIVE FEATURE FORMATION AND STRUCTURE

PRIORITY CLAIM AND CROSS-REFERENCE

This application is a divisional of U.S. application Ser. No. 15/939,572, filed on Mar. 29, 2018, entitled "Conductive Feature Formation and Structure", which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
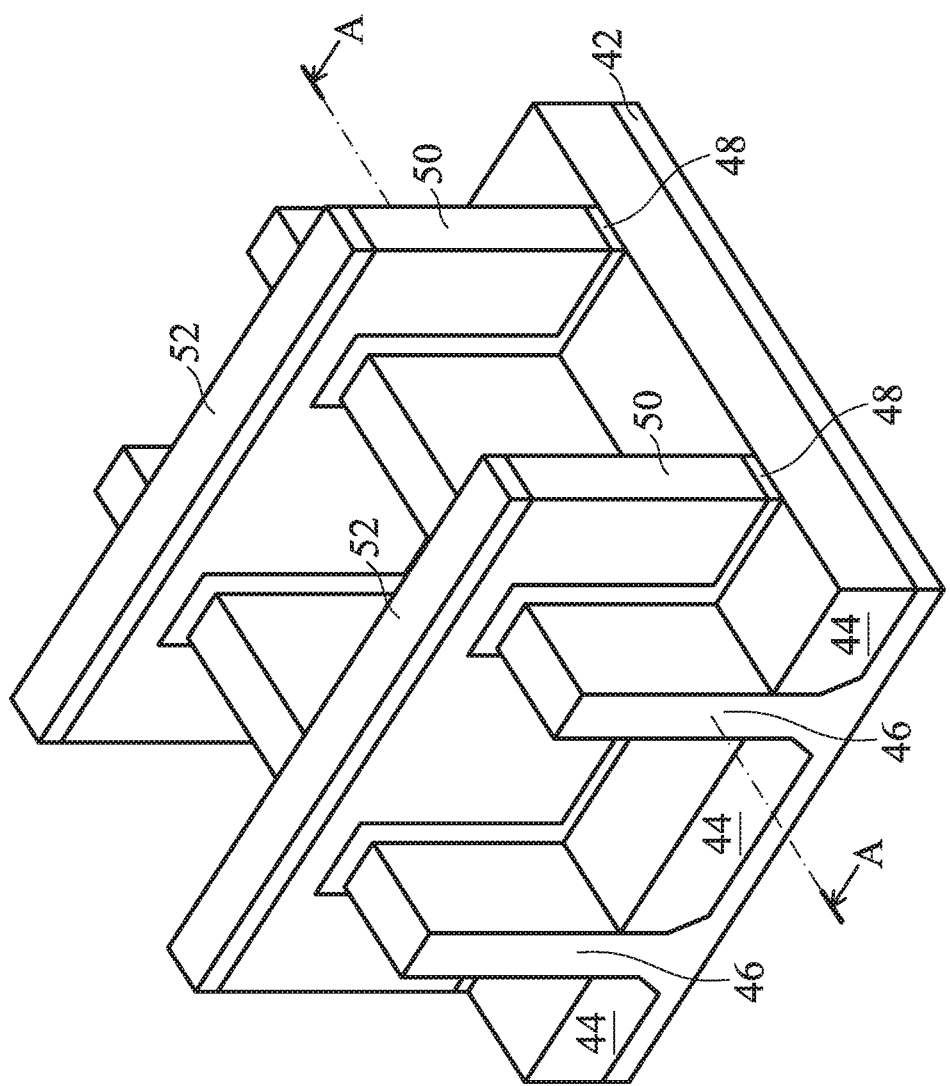
FIGS. 1 through 13 are views of respective intermediate structures at respective stages during an example method for forming conductive features in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. In some examples, a blocking region is formed on a conductive feature by modifying a composition of the conductive feature at a surface of the conductive feature. An overlying conductive feature, formed in an overlying dielectric layer, can be formed to the blocking region. The blocking region can, among other benefits, provide protection against a chemical that could etch the conductive feature on which the blocking layer is formed. For example, processes implemented in the formation of the overlying conductive feature may use a chemical that can penetrate an interface between the overlying dielectric and conductive feature. The blocking region may prevent the chemical from etching the underlying conductive feature. Other benefits can be achieved.

Example embodiments described herein are described in the context of forming conductive features in Front End Of the Line (FEOL) and/or Middle End Of the Line (MEOL) processing for a Fin Field Effect Transistor (FinFET). Other embodiments may be implemented in other contexts, such as with different devices, such as planar Field Effect Transistors (FETs), Vertical Gate All Around (VGAA) FETs, Horizontal Gate All Around (HGAA) FETs, bipolar junction transistors (BJTs), diodes, capacitors, inductors, resistors, etc. In some instances, the conductive feature may be part of the device, such as a plate of a capacitor or a line of an inductor. Further, some embodiments may be implemented in Back End Of the Line (BEOL) processing and/or for forming any conductive feature. Implementations of some aspects of the present disclosure may be used in other processes and/or in other devices.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1 through 13 illustrate views of respective intermediate structures at respective stages during an example method for forming conductive features in accordance with some embodiments. FIG. 1 illustrates a perspective view of an intermediate structure at a stage of the example method. The intermediate structure, as described in the following, is used in the implementation of FinFETs. Other structures may be implemented in other example embodiments.

The intermediate structure includes first and second fins 46 formed on a semiconductor substrate 42, with respective isolation regions 44 on the semiconductor substrate 42 between neighboring fins 46. First and second dummy gate stacks are along respective sidewalls of and over the fins 46. The first and second dummy gate stacks each include an interfacial dielectric 48, a dummy gate 50, and a mask 52.

The semiconductor substrate 42 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate may include an elemental semiconductor such as silicon (Si) or germanium (Ge); a compound semiconductor; an alloy semiconductor; or a combination thereof.

The fins 46 are formed in the semiconductor substrate 42. For example, the semiconductor substrate 42 may be etched such that trenches are formed between neighboring pairs of fins 46 and such that the fins 46 protrude from the semiconductor substrate 42 using appropriate photolithography and etch processes. Isolation regions 44 are formed with each being in a corresponding trench. The isolation regions 44 may include or be an insulating material such as an oxide (such as silicon oxide), a nitride, the like, or a combination thereof, and the insulating material may be deposited using an appropriate deposition process. The insulating material may be recessed after being deposited to form the isolation regions 44. The insulating material is recessed such that the fins 46 protrude from between neighboring isolation regions 44, which may, at least in part, thereby delineate the fins 46 as active areas on the semiconductor substrate 42. Further, top surfaces of the isolation regions 44 may have a flat surface as illustrated, a convex surface, a concave surface (such as dishing), or a combination thereof, which may result from an etch process. A person having ordinary skill in the art will readily understand that the processes described above are just examples of how fins 46 may be formed. In other examples, the fins 46 may be formed by other processes and may include heteroepitaxial and/or homoepitaxial structures.

The dummy gate stacks are formed on the fins 46. In a replacement gate process as described herein, the interfacial dielectrics 48, dummy gates 50, and masks 52 for the dummy gate stacks may be formed by sequentially forming respective layers by appropriate processes, and then patterning those layers into the dummy gate stacks by appropriate photolithography and etching processes. For example, the interfacial dielectrics 48 may include or be silicon oxide, silicon nitride, the like, or multilayers thereof. The dummy gates 50 may include or be silicon (e.g., polysilicon) or another material. The masks 52 may include or be silicon nitride, silicon oxynitride, silicon carbon nitride, the like, or a combination thereof.

In other examples, instead of and/or in addition to the dummy gate stacks, the gate stacks can be operational gate stacks (or more generally, gate structures) in a gate-first process. In a gate-first process, the interfacial dielectric 48 may be a gate dielectric layer, and the dummy gate 50 may be a gate electrode. The gate dielectric layers, gate electrodes, and masks 52 for the operational gate stacks may be formed by sequentially forming respective layers by appropriate processes, and then patterning those layers into the gate stacks by appropriate photolithography and etching processes. For example, the gate dielectric layers may include or be silicon oxide, silicon nitride, a high-k dielectric material, the like, or multilayers thereof. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate electrodes may include or be silicon (e.g., polysilicon, which may be doped or undoped), a metal-containing material (such as titanium, tungsten, aluminum, ruthenium, or the like), a combination thereof (such as a silicide (which may be subsequently formed), or multiple layers thereof. The masks 52 may include or be silicon nitride, silicon oxynitride, silicon carbon nitride, the like, or a combination thereof.

Figure 2:
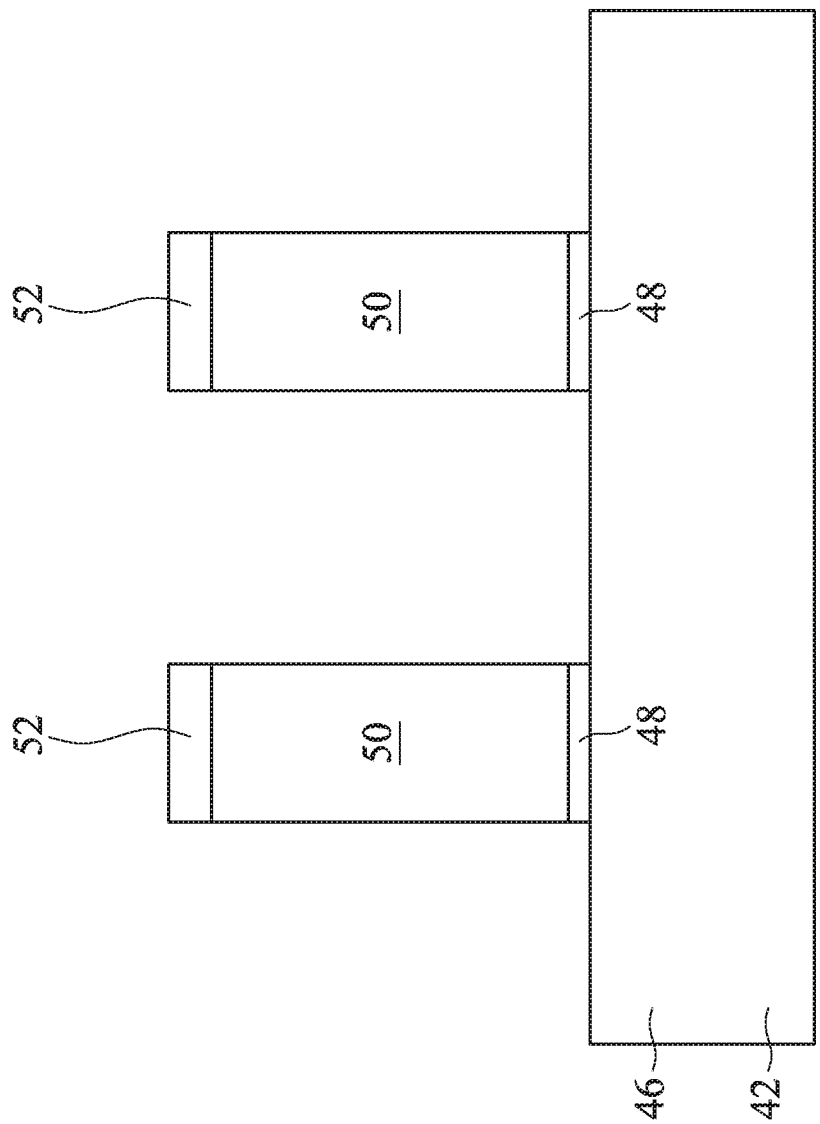

FIG. 1 further illustrates a reference cross-section that is used in later figures. Cross-section A-A is in a plane along, e.g., channels in the fin 46 between opposing source/drain regions. The FIGS. 2 through 13 and 15 through 18 illustrate cross-sectional views at various stages of processing in various example methods corresponding to cross-section A-A. FIG. 2 illustrates a cross-sectional view of the intermediate structure of FIG. 1 at the cross-section A-A.

Figure 3:
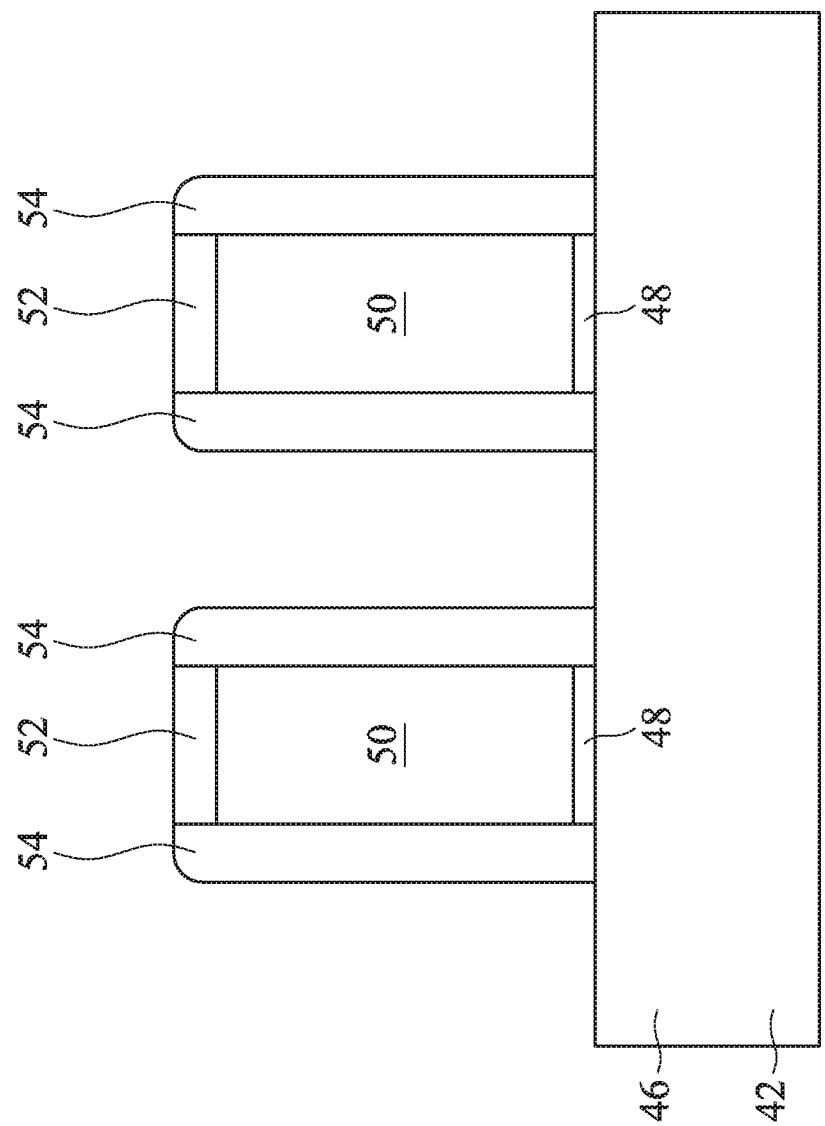

FIG. 3 illustrates the formation of gate spacers 54. Gate spacers 54 are formed along sidewalls of the dummy gate stacks (e.g., sidewalls of the interfacial dielectrics 48, dummy gates 50, and masks 52) and over the fins 46. Residual gate spacers 54 may also be formed along sidewalls of the fins 46, for example, depending on the height of the fins 46 above the isolation regions 44. The gate spacers 54 may be formed by conformally depositing one or more layers for the gate spacers 54 and anisotropically etching the one or more layers, for example. The one or more layers for the gate spacers 54 may include or be silicon oxygen carbide, silicon nitride, silicon oxynitride, silicon carbon nitride, the like, multi-layers thereof, or a combination thereof, and may be deposited by CVD, ALD, or another deposition technique. The etch process can include a RIE, NBE, or another etch process.

Figure 4:
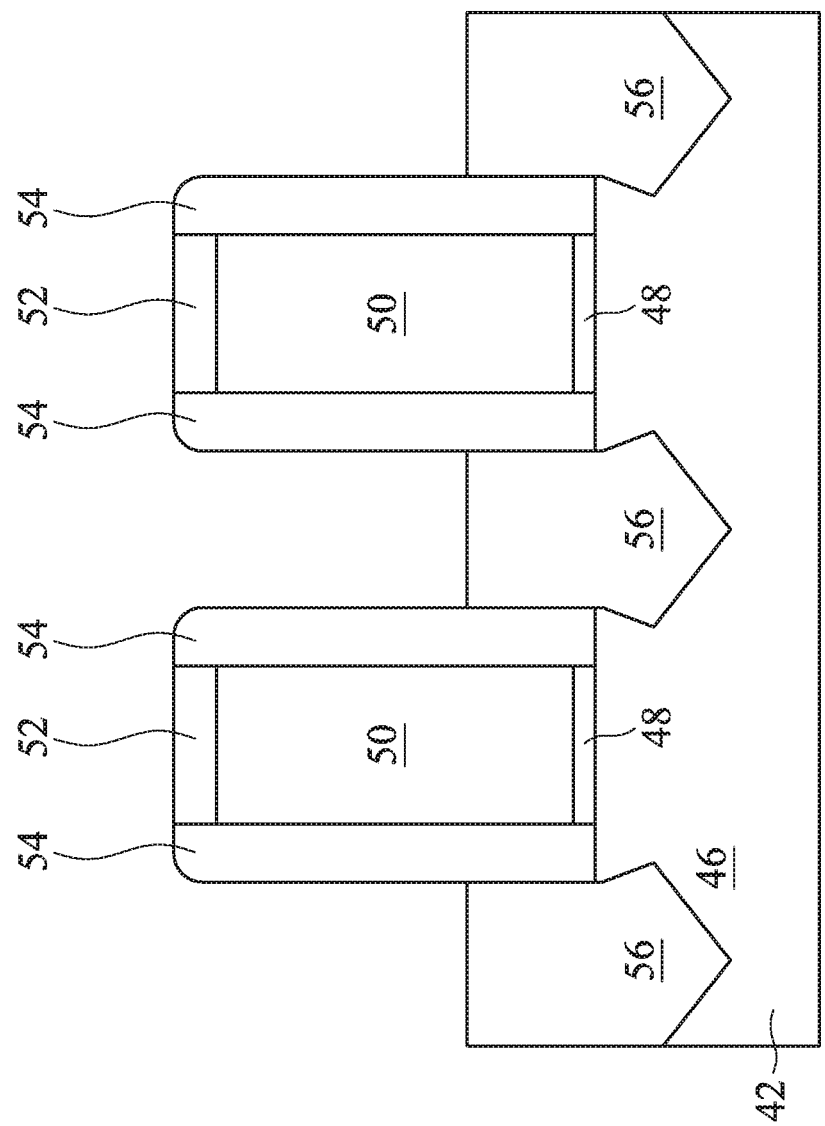

FIG. 4 illustrates the formation of epitaxy source/drain regions 56 in the fin 46. Recesses are formed in the fins 46 on opposing sides of the dummy gate stacks. The recessing can be by an etch process. The etch process can be isotropic or anisotropic, or further, may be selective with respect to one or more crystalline planes of the semiconductor substrate 42. Hence, the recesses can have various cross-sectional profiles based on the etch process implemented.

The epitaxy source/drain regions 56 are formed in the recesses. The epitaxy source/drain regions 56 may include or be silicon germanium, silicon carbide, silicon phosphorus, silicon carbon phosphorus, pure or substantially pure germanium, a III-V compound semiconductor, a II-VI compound semiconductor, or the like. The epitaxy source/drain regions 56 may be formed in the recesses by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. In some examples, epitaxy source/drain regions 56 can be raised with respect to the fins 46 and can have facets, which may correspond to crystalline planes of the semiconductor substrate 42.

A person having ordinary skill in the art will also readily understand that the recessing and epitaxial growth of FIG. 4 may be omitted, and that source/drain regions may be formed by implanting dopants into the fins 46 using the dummy gate stacks and gate spacers 54 as masks. In some examples where epitaxy source/drain regions 56 are implemented, the epitaxy source/drain regions 56 may also be doped, such as by in situ doping during epitaxial growth and/or by implanting dopants into the epitaxy source/drain regions 56 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 5:
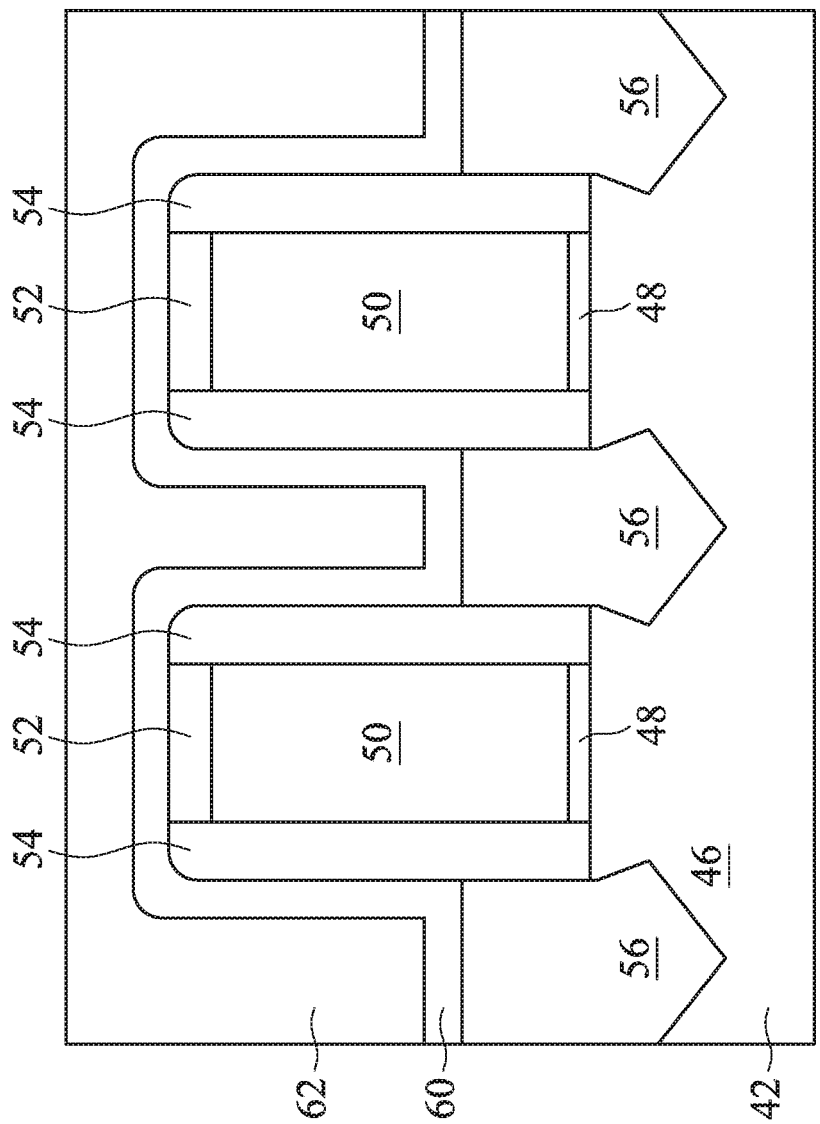

FIG. 5 illustrates the formation of a contact etch stop layer (CESL) 60 and a first interlayer dielectric (ILD) 62 over the CESL 60. Generally, an etch stop layer (ESL) can provide a mechanism to stop an etch process when forming, e.g., contacts or vias. An ESL may be formed of a dielectric material having a different etch selectivity from adjacent layers or components. The CESL 60 is conformally deposited on surfaces of the epitaxy source/drain regions 56, sidewalls and top surfaces of the gate spacers 54, top surfaces of the masks 52, and top surfaces of the isolation regions 44. The CESL 60 may comprise or be silicon nitride, silicon carbon nitride, silicon carbon oxide, carbon nitride, the like, or a combination thereof, and may be deposited by CVD, PECVD, ALD, or another deposition technique. The first ILD 62 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 62 may be deposited by spin-on, CVD, FCVD, PECVD, PVD, or another deposition technique.

The first ILD 62 may be planarized after being deposited, such as by a CMP. In a gate-first process, a top surface of the first ILD 62 may be above the upper portions of the CESL 60 and the gate stacks, and processing described below with respect to FIGS. 6 and 7 may be omitted. Hence, the upper portions of the CESL 60 and first ILD 62 may remain over the gate stacks.

Figure 6:
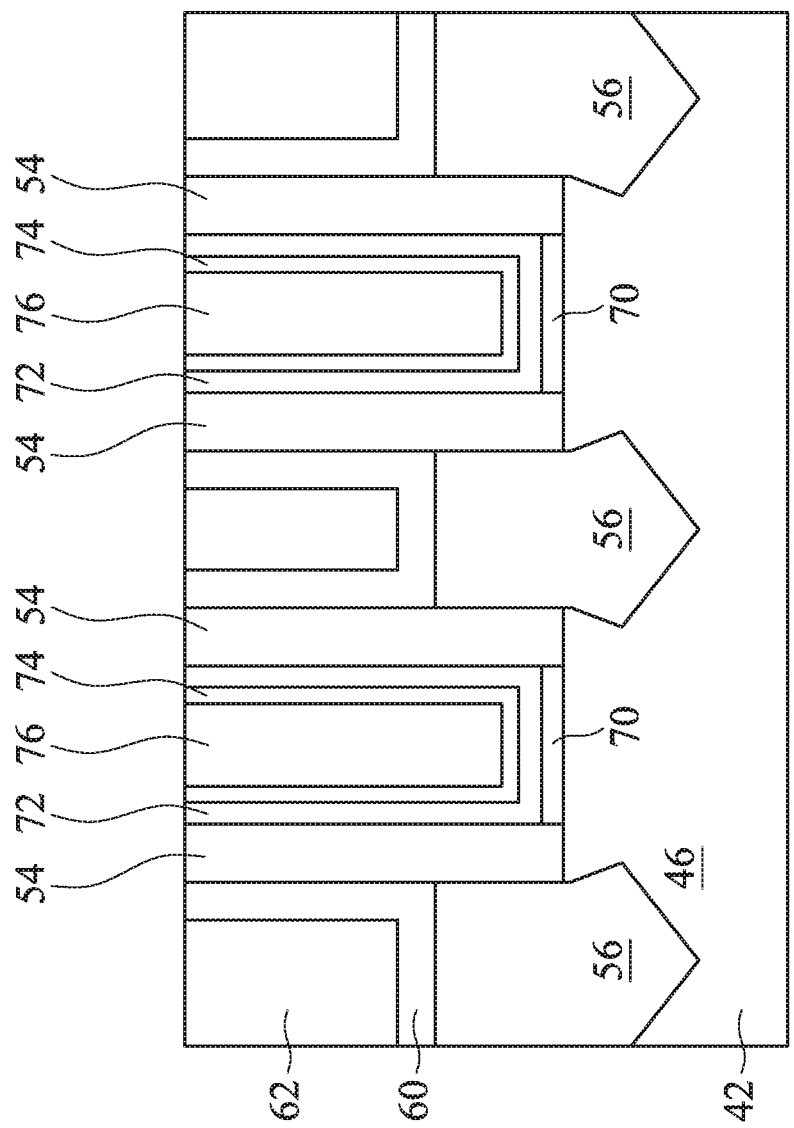

FIG. 6 illustrates the replacement of the dummy gate stacks with replacement gate structures. The first ILD 62 and CESL 60 are formed with top surfaces coplanar with top surfaces of the dummy gates 50. A planarization process, such as a CMP, may be performed to level the top surfaces of the first ILD 62 and CESL 60 with the top surfaces of the dummy gates 50. The CMP may also remove the masks 52 (and, in some instances, upper portions of the gate spacers 54) on the dummy gates 50. Accordingly, top surfaces of the dummy gates 50 are exposed through the first ILD 62 and the CESL 60.

With the dummy gates 50 exposed through the first ILD 62 and the CESL 60, the dummy gates 50 are removed, such as by one or more etch processes. The dummy gates 50 may be removed by an etch process selective to the dummy gates 50, wherein the interfacial dielectrics 48 act as ESLs, and subsequently, the interfacial dielectrics 48 can optionally be removed by a different etch process selective to the interfacial dielectrics 48. The etch processes can be, for example, a RIE, NBE, a wet etch, or another etch process. Recesses are formed between gate spacers 54 where the dummy gate stacks are removed, and channel regions of the fins 46 are exposed through the recesses.

The replacement gate structures are formed in the recesses where the dummy gate stacks were removed. The replacement gate structures each include, as illustrated, an interfacial dielectric 70, a gate dielectric layer 72, one or more optional conformal layers 74, and a gate electrode 76. The interfacial dielectric 70 is formed on sidewalls and top surfaces of the fins 46 along the channel regions. The interfacial dielectric 70 can be, for example, the interfacial dielectric 48 if not removed, an oxide (e.g., silicon oxide) formed by thermal or chemical oxidation of the fin 46, and/or an oxide (e.g., silicon oxide), nitride (e.g., silicon nitride), and/or another dielectric layer formed by CVD, ALD, MBD, or another deposition technique.

The gate dielectric layer 72 can be conformally deposited in the recesses where dummy gate stacks were removed (e.g., on top surfaces of the isolation regions 44, on the interfacial dielectric 70, and sidewalls of the gate spacers 54) and on the top surfaces of the first ILD 62, the CESL 60, and gate spacers 54. The gate dielectric layer 72 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 72 can be deposited by ALD, PECVD, MBD, or another deposition technique.

Then, the one or more optional conformal layers 74 can be conformally (and sequentially, if more than one) deposited on the gate dielectric layer 72. The one or more optional conformal layers 74 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof; and may be deposited by ALD, PECVD, MBD, or another deposition technique. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof; and may be deposited by ALD, PECVD, MBD, or another deposition technique. In some examples, a capping layer (e.g., a TiN layer) is formed conformally on the gate dielectric layer 72; a barrier layer (e.g., a TaN layer) is formed conformally on the capping layer; and one or more work-function tuning layers are sequentially formed conformally on the barrier layer.

A layer for the gate electrodes 76 is formed over the one or more optional conformal layers 74 (e.g., over the one or more work-function tuning layers), if implemented, and/or the gate dielectric layer 72. The layer for the gate electrodes 76 can fill remaining recesses where the dummy gate stacks were removed. The layer for the gate electrodes 76 may be or comprise a metal-containing material such as tungsten, cobalt, aluminum, ruthenium, copper, multi-layers thereof, a combination thereof, or the like. The layer for the gate electrodes 76 can be deposited by ALD, PECVD, MBD, PVD, or another deposition technique. Portions of the layer for the gate electrodes 76, one or more optional conformal layers 74, and gate dielectric layer 72 above the top surfaces of the first ILD 62, the CESL 60, and gate spacers 54 are removed. For example, a planarization process, like a CMP, may remove the portions of the layer for the gate electrodes 76, one or more optional conformal layers 74, and gate dielectric layer 72 above the top surfaces of the first ILD 62, the CESL 60, and gate spacers 54. The replacement gate structures comprising the gate electrodes 76, one or more optional conformal layers 74, gate dielectric layer 72, and interfacial dielectric 70 may therefore be formed as illustrated in FIG. 6.

Figure 7:
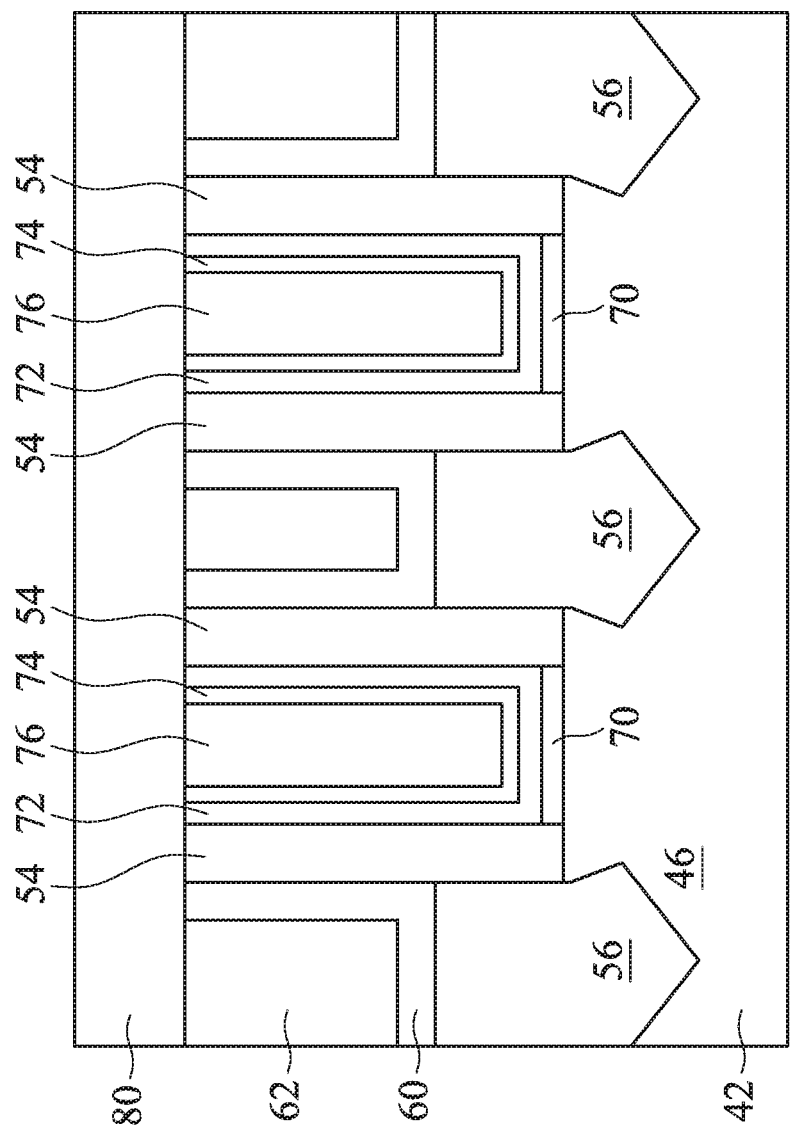

FIG. 7 illustrates the formation of a second ILD 80 over the first ILD 62, CESL 60, gate spacers 54, and replacement gate structures. Although not illustrated, in some examples, an ESL may be deposited over the first ILD 62, etc., and the second ILD 80 may be deposited over the ESL. If implemented, the ESL may comprise or be silicon nitride, silicon carbon nitride, silicon carbon oxide, carbon nitride, the like, or a combination thereof, and may be deposited by CVD, PECVD, ALD, or another deposition technique. The second ILD 80 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 80 may be deposited by spin-on, CVD, FCVD, PECVD, PVD, or another deposition technique.

Figure 8:
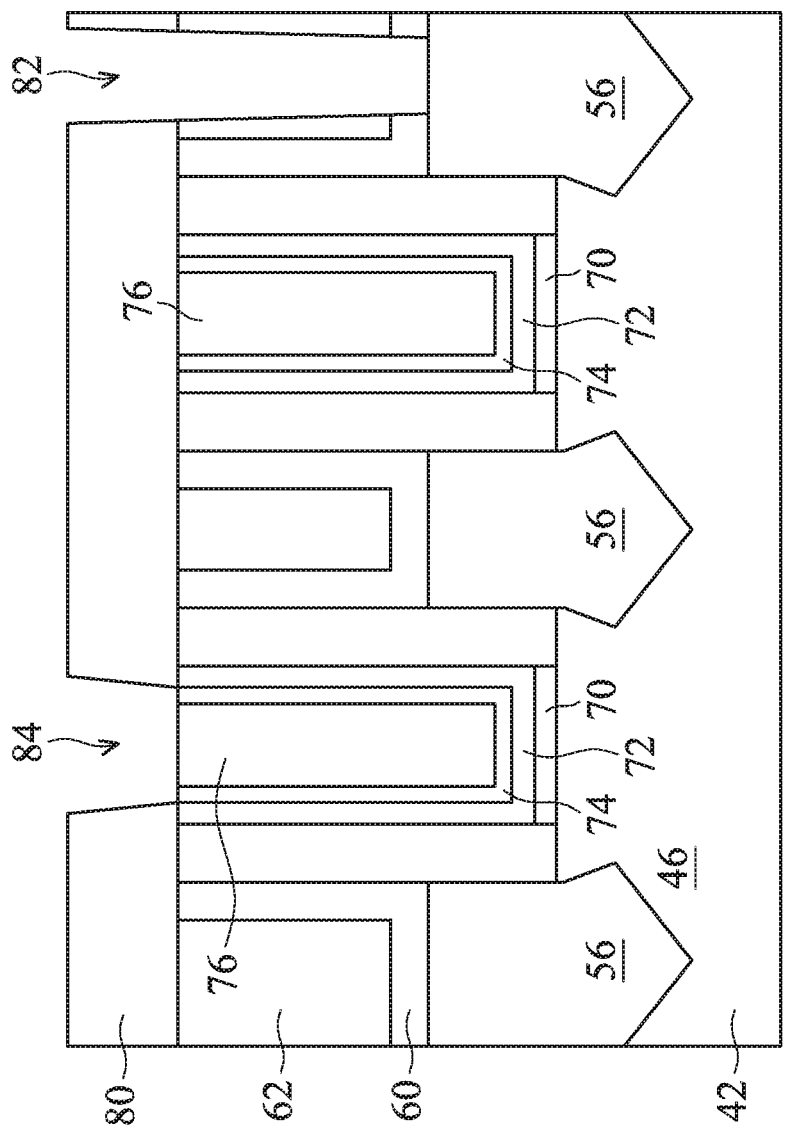

FIG. 8 illustrates the formation of respective openings 82 and 84 through the second ILD 80, the first ILD 62, and the CESL 60 to expose at least a portion of an epitaxy source/drain region 56, and through the second ILD 80 to expose at least a portion of a replacement gate structure. The second ILD 80, the first ILD 62, and the CESL 60 may be patterned with the openings 82 and 84, for example, using photolithography and one or more etch processes.

Figure 9:
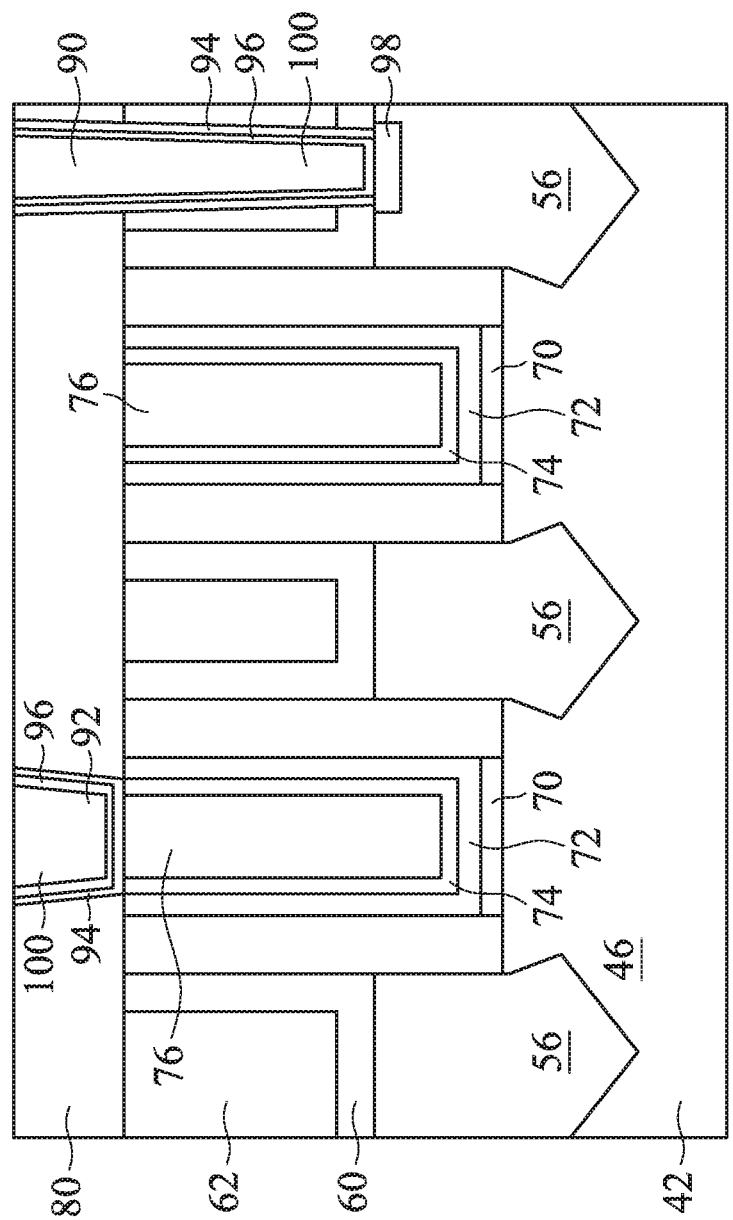

FIG. 9 illustrates the formation of conductive features 90 and 92 in the openings 82 and 84 to the epitaxy source/drain region 56 and to the replacement gate structure, respectively. The conductive feature 90 includes, in the illustrated example, an adhesion layer 94, a barrier layer 96 on the adhesion layer 94, a silicide region 98 on the epitaxy source/drain region 56, and conductive fill material 100 on the barrier layer 96, for example. The conductive feature 92 includes, in the illustrated example, an adhesion layer 94, a barrier layer 96 on the adhesion layer 94, and conductive fill material 100 on the barrier layer 96, for example.

The adhesion layer 94 can be conformally deposited in the openings 82 and 84 (e.g., on sidewalls of the openings 82 and 84, exposed surface of the epitaxy source/drain region 56, and exposed surface of the replacement gate structure) and over the second ILD 80. The adhesion layer 94 may be or comprise titanium, tantalum, the like, or a combination thereof, and may be deposited by ALD, CVD, PVD, or another deposition technique. The barrier layer 96 can be conformally deposited on the adhesion layer 94, such as in the openings 82 and 84 and over the second ILD 80. The barrier layer 96 may be or comprise titanium nitride, titanium oxide, tantalum nitride, tantalum oxide, the like, or a combination thereof, and may be deposited by ALD, CVD, or another deposition technique. In some examples, at least a portion of the adhesion layer 94 can be treated to form the barrier layer 96. For example, a nitridation process, such as including a nitrogen plasma process, can be performed on the adhesion layer 94 to convert at least the portion of the adhesion layer 94 into the barrier layer 96. In some examples, the adhesion layer 94 can be completely converted such that no adhesion layer 94 remains and the barrier layer 96 is an adhesion/barrier layer, while in other examples, a portion of the adhesion layer 94 remains unconverted such that the portion of the adhesion layer 94 remains with the barrier layer 96 on the adhesion layer 94.

Silicide region 98 may be formed on the epitaxy source/drain region 56 by reacting an upper portion of the epitaxy source/drain region 56 with the adhesion layer 94, and possibly, the barrier layer 96. An anneal can be performed to facilitate the reaction of the epitaxy source/drain region 56 with the adhesion layer 94 and/or barrier layer 96.

The conductive fill material 100 can be deposited on the barrier layer 96 and fill the openings 82 and 84. The conductive fill material 100 may be or comprise cobalt, tungsten, copper, ruthenium, aluminum, gold, silver, alloys thereof, the like, or a combination thereof, and may be deposited by CVD, ALD, PVD, or another deposition technique. After the conductive fill material 100 is deposited, excess conductive fill material 100, barrier layer 96, and adhesion layer 94 may be removed by using a planarization process, such as a CMP, for example. The planarization process may remove excess conductive fill material 100, barrier layer 96, and adhesion layer 94 from above a top surface of the second ILD 80. Hence, top surfaces of the conductive features 90 and 92 and the second ILD 80 may be coplanar. The conductive features 90 and 92 may be or may be referred to as contacts, plugs, etc.

Although FIGS. 8 and 9 illustrate the conductive feature 90 to the epitaxy source/drain region 56 and the conductive feature 92 to the replacement gate structure being formed simultaneously, the respective conductive features 90 and 92 may be formed separately and sequentially. For example, the opening 82 to the epitaxy source/drain region 56 may be first formed, as in FIG. 8, and filled to form the conductive feature 90 to the epitaxy source/drain region 56, as in FIG. 9. Then, the opening 84 to the replacement gate structure may be formed, as in FIG. 9, and filled to form the conductive feature 92 to the replacement gate structure, as in FIG. 8. Another order of processing may be implemented.

Figure 10:
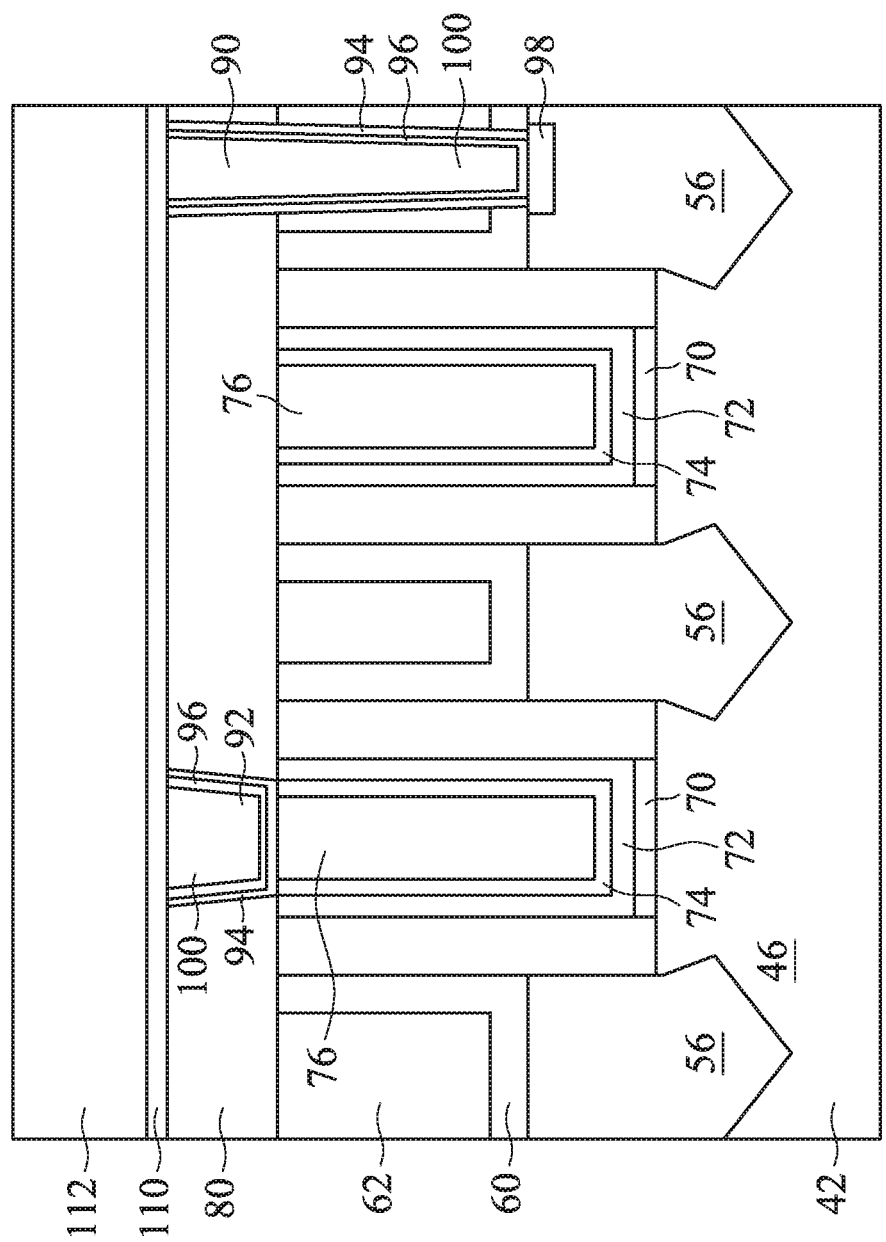

FIG. 10 illustrates the formation of an ESL 110 and an intermetallization dielectric (IMD) 112 over the ESL 110. The ESL 110 is deposited on top surfaces of the second ILD 80 and conductive features 90 and 92. The ESL 110 may comprise or be silicon nitride, silicon carbon nitride, silicon carbon oxide, carbon nitride, the like, or a combination thereof, and may be deposited by CVD, PECVD, ALD, or another deposition technique. The IMD 112 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The IMD 112 may be deposited by spin-on, CVD, FCVD, PECVD, PVD, or another deposition technique. A thickness of the ESL 110 can be in a range from about 3 nm to about 100 nm, and a thickness of the IMD 112 can be in a range from about 5 nm to about 100 nm. A combined thickness of the IMD 112 and ESL 110 can be in a range from about 5 nm to about 200 nm.

Figure 11:
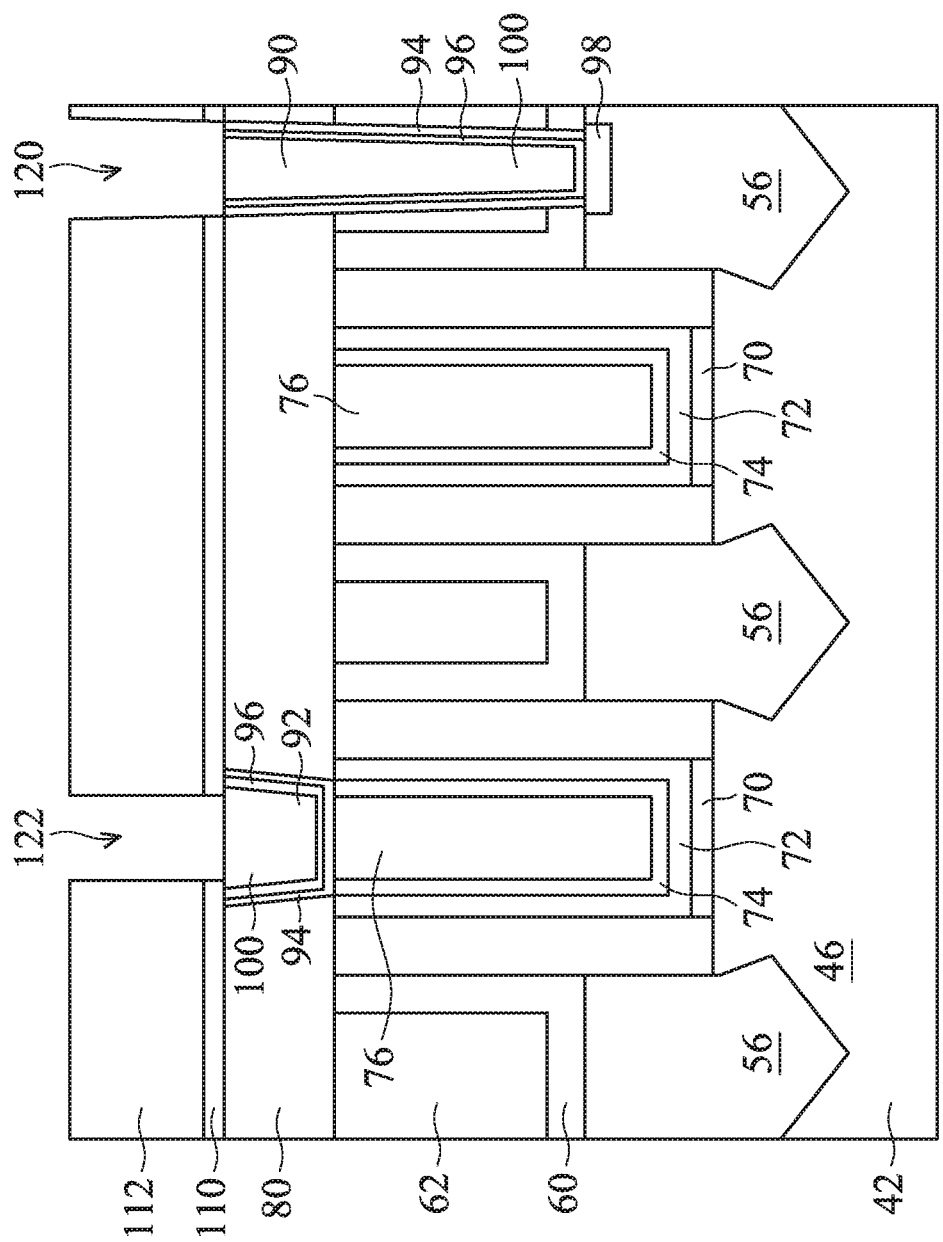

FIG. 11 illustrates the formation of openings 120 and 122 to the conductive features 90 and 92, respectively, through the IMD 112 and ESL 110. The IMD 112 and ESL 110 may be patterned with the openings 120 and 122, for example, using photolithography and one or more etch processes. The etch process may include a RIE, NBE, ICP etch, capacitively coupled plasma (CCP) etch, ion beam etch (IBE), the like, or a combination thereof. The etch process may be anisotropic. In some examples, the etch process can include a plasma using a first gas comprising carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), a carbon fluoride (e.g., $C_xF_y$, where x can be in a range from 1 to 5 and y can be in a range from 4 to 8), the like, or a combination thereof. The plasma can further use a second gas comprising nitrogen ($N_2$), hydrogen ($H_2$), oxygen ($O_2$), argon (Ar), xenon (Xe), helium (He), carbon monoxide (CO), carbon dioxide ($CO_2$), carbonyl sulfide (COS), the like, or a combination thereof. In some examples, a ratio of the flow rate of the first gas to the flow rate of the second gas can be in a range from about 0.001 to about 1000. In some examples, a flow rate of the first gas can be in a range from about 5 standard cubic centimeter per minute (sccm) to about 500 sccm, and a flow rate of the second gas can be in a range from about 5 sccm to about 500 sccm. A pressure of the plasma etch can be in a range from about 5 mTorr to about 120 mTorr. A power of the plasma generator for the plasma etch can be in a range from about 30 W to about 5000 W. A frequency of the plasma generator for the plasma etch can be, for example, 40 KHz, 2 MHz, 13.56 MHz, or in a range from about 12 MHz to about 100 MHz. A substrate bias voltage of the plasma etch can be in a range from about 20 V to about 500 V and with a duty cycle in a range from about 10% to about 60%.

The openings 120 and 122 may be cleaned, such as by a wet cleaning process and a dry plasma process. The wet cleaning process can include immersing the semiconductor substrate 42 in a solution comprising mixed acids and/or the like. The solution, during the immersion, may be at a temperature in a range from about 15° C. to about 65° C. The semiconductor substrate 42 may be immersed in the solution for a duration in a range from about 5 seconds to about 200 seconds. The semiconductor substrate 42 may be rinsed in a deionized water rinse following the immersion in the solution. The semiconductor substrate 42 may also be rinsed in isopropyl alcohol (IPA) following the immersion in the solution to dry the semiconductor substrate 42.

A dry plasma process can be performed after the wet cleaning process to further clean the openings 120 and 122. The plasma process can remove an oxide formed in the openings 120 and 122 (e.g., on the surfaces of the conductive fill material 100), for example. In some examples, the plasma process can include a plasma using a gas comprising hydrogen ($H_2$), nitrogen ($N_2$), the like, or a combination thereof. In some examples, a flow rate of the gas can be in a range from about 10 sccm to about 10,000 sccm. A pressure of the plasma process can be in a range from about 0.1 mTorr to about 100 Torr. A power of the plasma generator for the plasma process can be in a range from about 50 W to about 1000 W. A frequency of the plasma generator for the plasma process can be can be in a range from about 350 kHz to about 40 MHz. A substrate bias voltage of the plasma process can be in a range from about 0 V to about 1 kV and with a duty cycle in a range from about 30% to about 70%.

Figure 12:
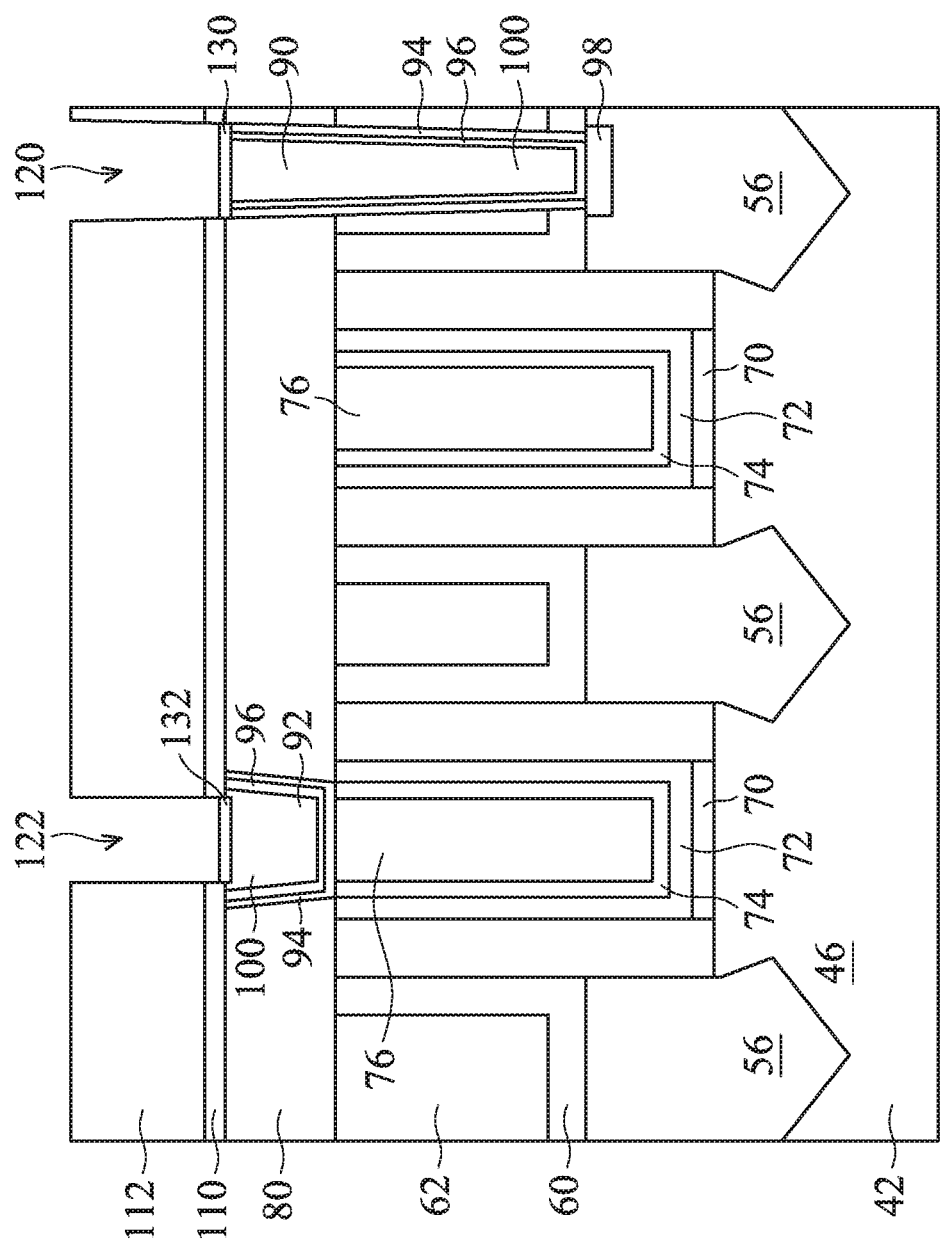

FIG. 12 illustrates the formation of blocking regions 130 and 132 on the portions of the conductive features 90 and 92 exposed through the openings 120 and 122, respectively. The blocking regions 130 and 132 are formed with a different material composition from the underlying conductive fill material 100 of the conductive features 90 and 92, respectively. The blocking regions 130 and 132 can be formed by providing a species in the conductive features 90 and 92 (e.g., the conductive fill material 100) that changes the material composition at the portions of top surfaces of the conductive features 90 and 92 exposed by the openings 120 and 122. The blocking regions 130 and 132 are formed at the portions of surfaces exposed through the openings 120 and 122, respectively, and not at portions of surfaces that are not exposed (e.g., portions of surfaces covered by the ESL 110 and/or IMD 112). Hence, in this example, the lateral dimensions of the blocking regions 130 and 132 are co-extensive with the respective lateral dimensions of the openings 120 and 122 (e.g., between sidewalls of the ESL 110 and/or IMD 112) proximate the bottom of the openings 120 and 122.

In some examples, a species can be provided in the conductive features 90 and 92 by diffusing the species into the conductive features 90 and 92. Diffusion of the species, in some examples, can be implemented using a chemical soak without a plasma, a plasma treatment, or another technique.

In an example, a chemical soak without a plasma can be implemented by a CVD process. A gas mixture used in the chemical soak can include silane ($SiH_4$), as an example, and a carrier gas, such as argon. The silane gas can provide a silicon-containing species for diffusion into the conductive features 90 and 92. For example, the silicon from the silane may diffuse into and react with the conductive features 90 and 92, while hydrogen from the silane may be a byproduct from the silicon reacting with the conductive features 90 and 92 and may be purged by a flow of gas and/or may also diffuse into the conductive features 90 and 92. Hence, the blocking regions 130 and 132 can be silicide regions. In the CVD process without a plasma, a ratio of the flow rate of the silane gas to the flow rate of the argon gas can be in a range from about 0.01 to about 0.2. The flow rate of the silane gas can be in a range from about 50 sccm to about 500 sccm, and the flow rate of the argon gas can be in a range from about 1000 sccm to about 8000 sccm. A pressure of the CVD process can be in a range from about 10 Torr to about 50 Torr. A temperature of the CVD process can be in a range from about 200° C. to about 450° C. A duration of the chemical soak without a plasma can be in a range from about 10 second to about 150 seconds.

In another example, a plasma treatment can be implemented by a CVD process with a direct plasma (e.g., a PECVD process). A gas mixture used in the plasma treatment can include silane ($SiH_4$), as an example, and a carrier gas, such as argon. Similar to the chemical soak above, the silane gas can provide a silicon-containing species for diffusion into the conductive features 90 and 92, and the blocking regions 130 and 132 can be silicide regions. In the CVD process with a direct plasma, a ratio of the flow rate of the silane gas to the flow rate of the argon gas can be in a range from about $10^{-3}$ to about 0.2. The flow rate of the silane gas can be in a range from about 1 sccm to about 500 sccm, and the flow rate of the argon gas can be in a range from about 1000 sccm to about 8000 sccm. A pressure of the CVD process can be in a range from about 0.1 Torr to about 100 Torr. A temperature of the CVD process can be in a range from about 150° C. to about 300° C. A power of the plasma generator can be in a range from about 200 W to about 500 W, and a frequency of the plasma generator can be in a range from about 2 MHz to about 40 MHz, such as about 13.56 MHz. The plasma treatment can be conformal, such as without biasing a substrate holder of the CVD process, or may be directional, such as by biasing the substrate holder. A duration of the plasma treatment can be in a range from about 5 second to about 120 seconds.

In some examples, a species can be provided in the conductive features 90 and 92 by implanting the species into the conductive features 90 and 92. In an example, a species for implantation can include phosphorus, boron, and/or the like. In such examples, the implant energy can be in a range from about 0.5 keV to about 5 keV, with a dosage concentration in a range from about $10^{12}$ $cm^{-2}$ to about $10^{17}$ $cm^{-2}$.

Different techniques can be used to change the material composition at the top surfaces of the conductive features 90 and 92 exposed by the openings 120 and 122. Further, in the above examples and/or in different techniques, different species may be used to be diffused and/or implanted into the conductive features 90 and 92. For example, germanium, nitrogen, carbon, arsenic, tin, and/or other species may be implemented. As examples, germane (GeH$_4$) can be implemented instead of or in addition to silane in the preceding examples with the chemical soak and plasma treatment, which may form a germanide as the blocking regions 130 and 132. Further, germanium can be implanted to from a germanide as the blocking regions 130 and 132. Similarly, nitrogen can be used in the chemical soak, plasma treatment, and implantation to form a metal nitride as the blocking regions 130 and 132. Other species may be implemented to form different compositions as the blocking regions 130 and 132.

Generally, the blocking regions 130 and 132 can have the form MS$_x$, where "M" is a metal at the top surface of the conductive features 90 and 92, "S" is the species implemented to modify the material composition at the top surfaces of the conductive features 90 and 92, and "x" is a concentration of the species S. As specific examples, the conductive fill material 100 can be cobalt (Co), tungsten (W), copper (Cu), ruthenium (Ru), etc., and the species can be silicon (Si), germanium (Ge), boron (B), arsenic (As), phosphorus (P), nitrogen (N), carbon (C), tin (Sn), etc. Hence, the blocking regions 130 and 132 may be or include a metal-semiconductor compound, such as CoSi$_x$, CoGe$_x$, CoB$_x$, CoAs$_x$, WSi$_x$, WGe$_x$, WB$_x$, WAs$_x$, CuSi$_x$, CuGe$_x$, CuB$_x$, CuAs$_x$, RuSi$_x$, RuGe$_x$, RuB$_x$, RuAs$_x$, etc.; a metal-nonmetal compound, such as CoP$_x$, CoN$_x$, CoC$_x$, WP$_x$, WN$_x$, WC$_x$, CuP$_x$, CuN$_x$, CuC$_x$, RuP$_x$, RuN$_x$, RuC$_x$, etc.; or a metal-metal compound, such as CoSn$_x$, WSn$_x$, CuSn$_x$, RuSn$_x$, etc. The value of x can be in a range from about 1 to about 8 for any metal-semiconductor compound. A thickness of the blocking regions 130 and 132 can be in a range from about 3 nm to about 5 nm.

Figure 13:
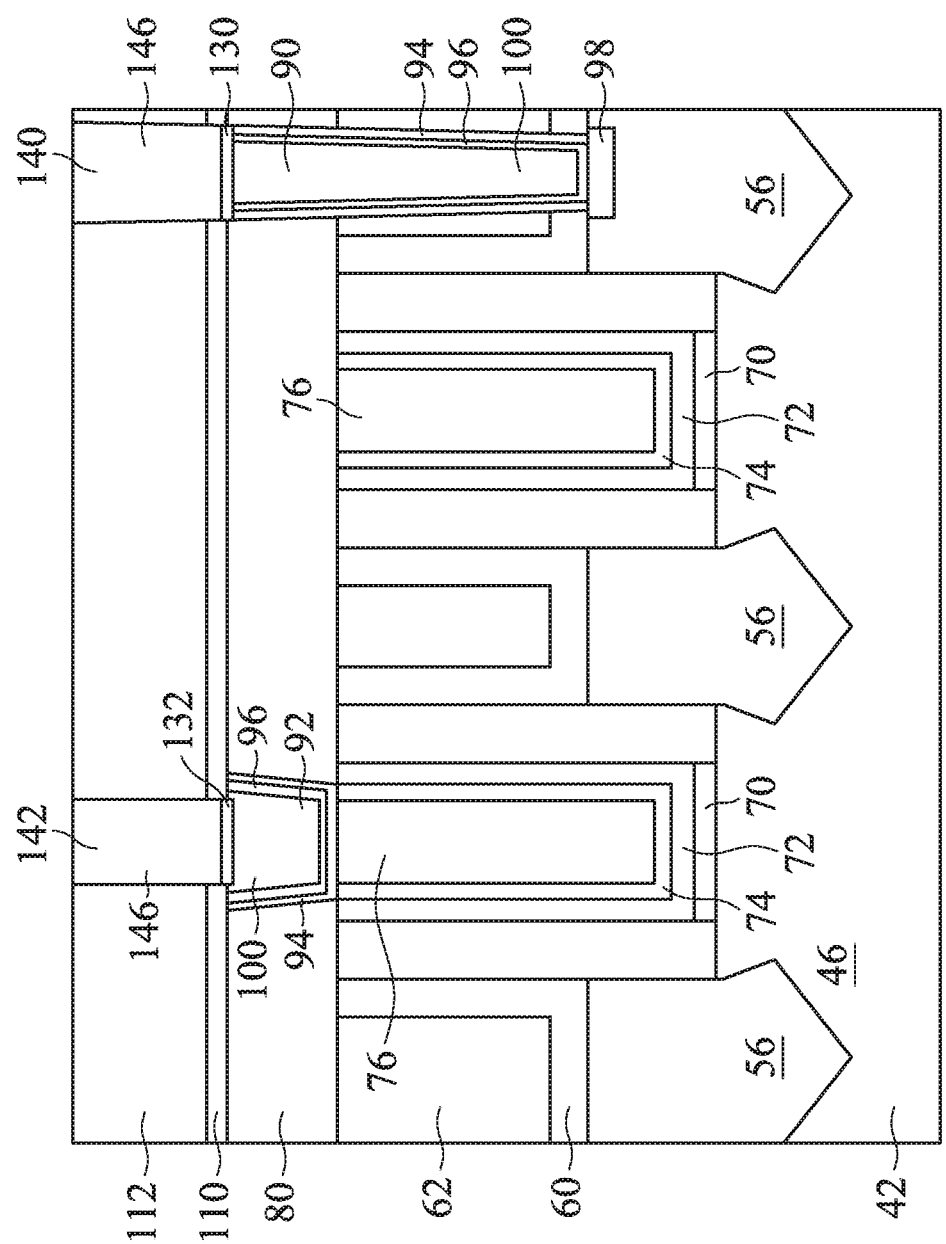

FIG. 13 illustrates the formation of conductive features 140 and 142 in the openings 120 and 122 to the blocking regions 130 and 132, respectively. Each conductive feature 140 and 142, as illustrated, includes conductive fill material 146, for example. The conductive fill material 146 can be deposited in and fill the openings 120 and 122. The conductive fill material 146 may be or comprise tungsten, cobalt, copper, ruthenium, aluminum, gold, silver, alloys thereof, the like, or a combination thereof, and may be deposited by CVD, ALD, PVD, electroplating, or another deposition technique. After the conductive fill material 146 is deposited, excess conductive fill material 146 may be removed by using a planarization process, such as a CMP, for example. The planarization process may remove excess conductive fill material 146 from above a top surface of the IMD 112. Hence, top surfaces of the conductive features 140 and 142 and the IMD 112 may be coplanar. The conductive features 140 and 142 may be or may be referred to as contacts, plugs, conductive lines, conductive pads, vias, etc.

In some examples, a barrier and/or adhesion layer may be formed in the openings 120 and 122 before the conductive fill material 146 is deposited on the barrier and/or adhesion layer and in the openings 120 and 122. The barrier and/or adhesion layer can be conformally deposited in the openings 120 and 122 (e.g., on the blocking regions 130 and 132 and along sidewalls of the IMD 112) and over the IMD 112. The barrier and/or adhesion layer may be or comprise titanium nitride, titanium oxide, tantalum nitride, tantalum oxide, the like, or a combination thereof, and may be deposited by ALD, CVD, or another deposition technique. The barrier and/or adhesion layer over the IMD 112 may also be removed by the planarization process that removes excess conductive fill material 146 from above a top surface of the IMD 112, and hence, the barrier and/or adhesion layer may have top surfaces that are coplanar with top surfaces of the conductive fill material 146 and the IMD 112.

In this example, respective bottom portions of the conductive features 140 and 142 have lateral dimensions that are coextensive with corresponding lateral dimensions of the blocking regions 130 and 132, respectively. This follows generally from the formation of the blocking regions 130 and 132 through the openings 120 and 122 and the subsequent formation of the conductive features 140 and 142 in the openings 120 and 122, respectively.

Figure 14:
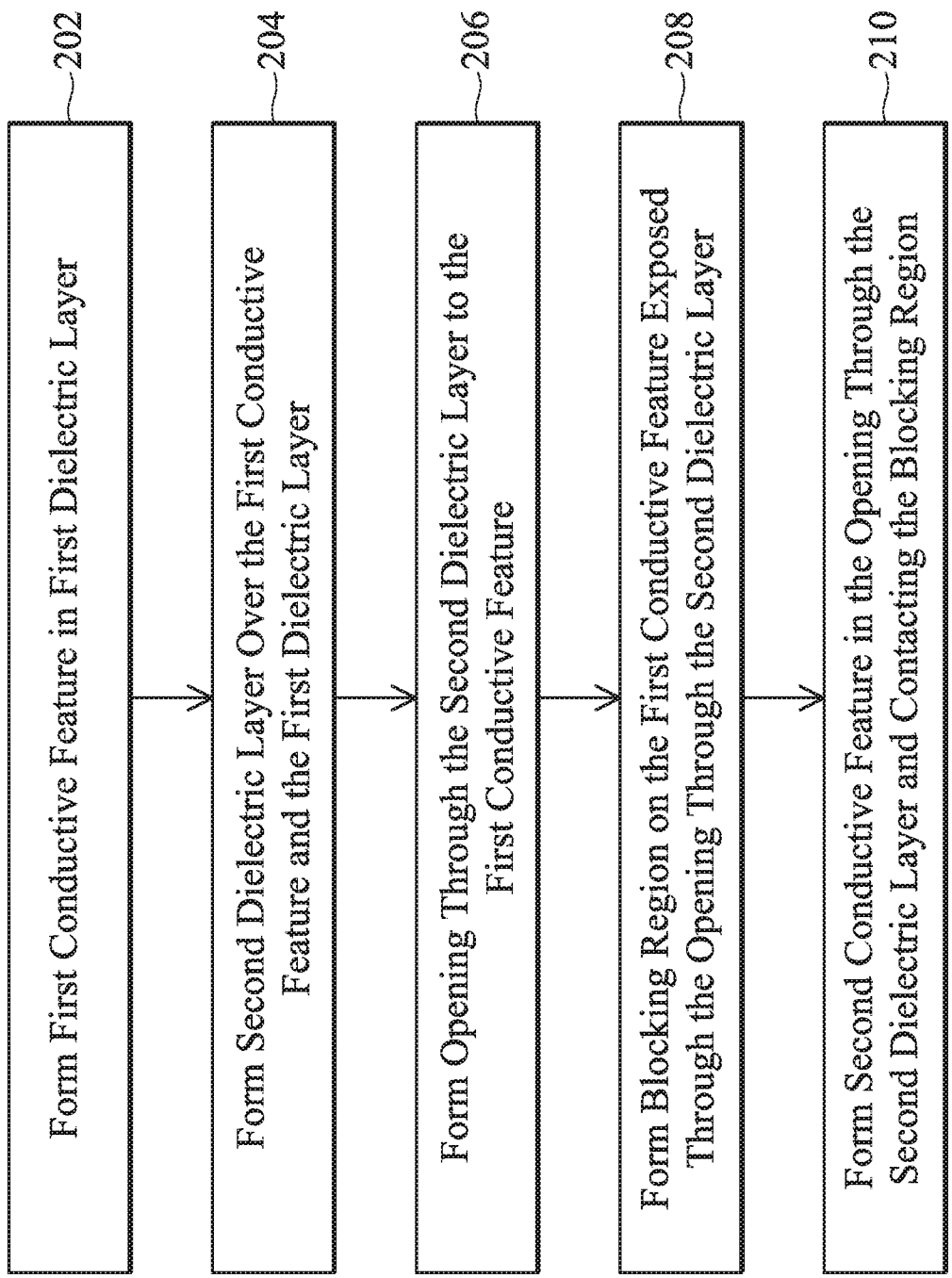
FIG. 14 is a flow chart of an example method for forming conductive features in accordance with some embodiments.

FIG. 14 is a flow chart of an example method for forming conductive features in accordance with some embodiments. In operation 202, a first conductive feature is formed in a first dielectric layer. An example of operation 202 is illustrated in and described with respect to FIGS. 8 and 9. For example, the conductive feature 90 is formed in the second ILD 80, the first ILD 62, and CESL 60.

In operation 204, a second dielectric layer is formed over the first conductive feature and the first dielectric layer. An example of operation 204 is illustrated in and described with respect to FIG. 10. For example, the ESL 110 and IMD 112 are formed over the conductive feature 90 and the second ILD 80, the first ILD 62, and CESL 60.

In operation 206, an opening is formed through the second dielectric layer to the first conductive feature. An example of operation 206 is illustrated in and described with respect to FIG. 11. For example, the opening 120 is formed through the ESL 110 and IMD 112 to the conductive feature 90.

In operation 208, a blocking region is formed on the first conductive feature exposed through the opening through the second dielectric layer. An example of operation 208 is illustrated in and described with respect to FIG. 12. For example, the blocking region 130 is formed on the conductive feature 90 exposed through the opening 120.

In operation 210, a second conductive feature is formed in the opening through the second dielectric layer and contacting the blocking region. An example of operation 210 is illustrated in and described with respect to FIG. 13. For example, the conductive feature 140 is formed in the opening 120 and contacting the blocking region 130.

FIGS. 15 through 18 illustrate cross-sectional views of respective intermediate structures at respective stages during another example method for forming conductive features in accordance with some embodiments. Processing proceeds through FIG. 9 as previously described and resumes with processing as described below with respect to FIG. 15.

Figure 15:
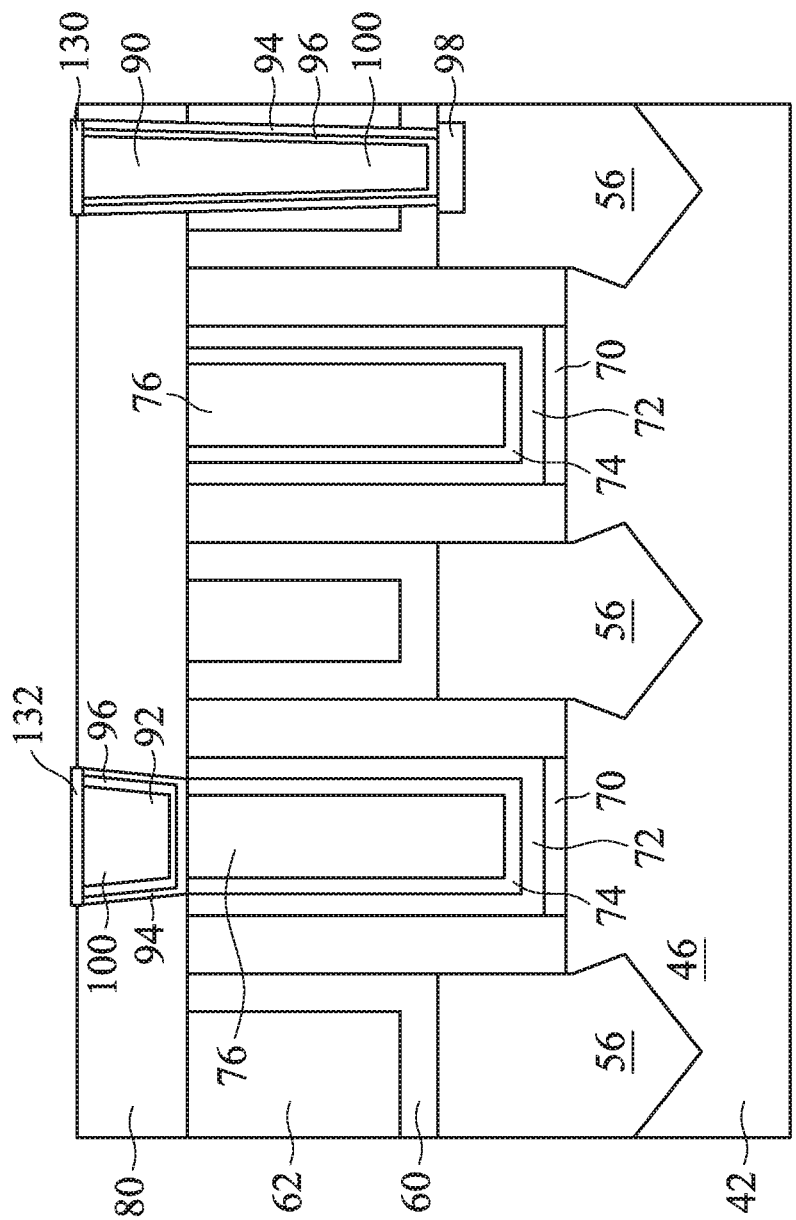
FIGS. 15 through 18 are cross-sectional views of respective intermediate structures at respective stages during another example method for forming conductive features in accordance with some embodiments.

FIG. 15 illustrates the formation of blocking regions 130 and 132 at the top surfaces of the conductive features 90 and 92. The formation of the blocking regions 130 and 132 may be performed as described above with respect to FIG. 12, and hence, further description herein is omitted for brevity. The blocking regions 130 and 132 may be formed throughout respective entireties of top surfaces of the conductive features 90 and 92 in this example.

Figure 16:
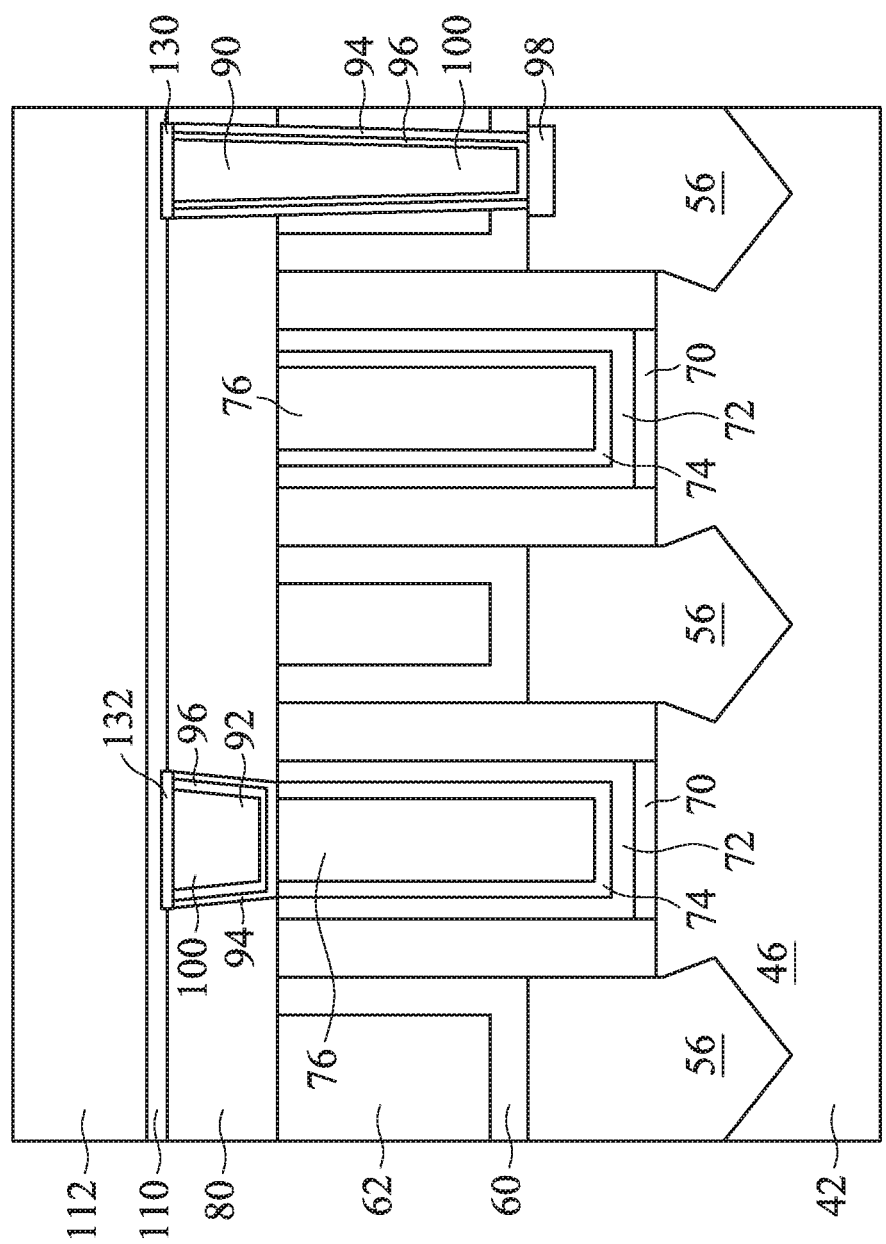

FIG. 16 illustrates the formation of the ESL 110 and the IMD 112 over the ESL 110. The ESL 110 is formed over top surfaces of the second ILD 80 and the blocking regions 130 and 132 on the conductive features 90 and 92, respectively. The IMD 112 is formed over the ESL 110. The formation of the ESL 110 and the IMD 112 may be performed as described above with respect to FIG. 10, and hence, further description herein is omitted for brevity.

Figure 17:
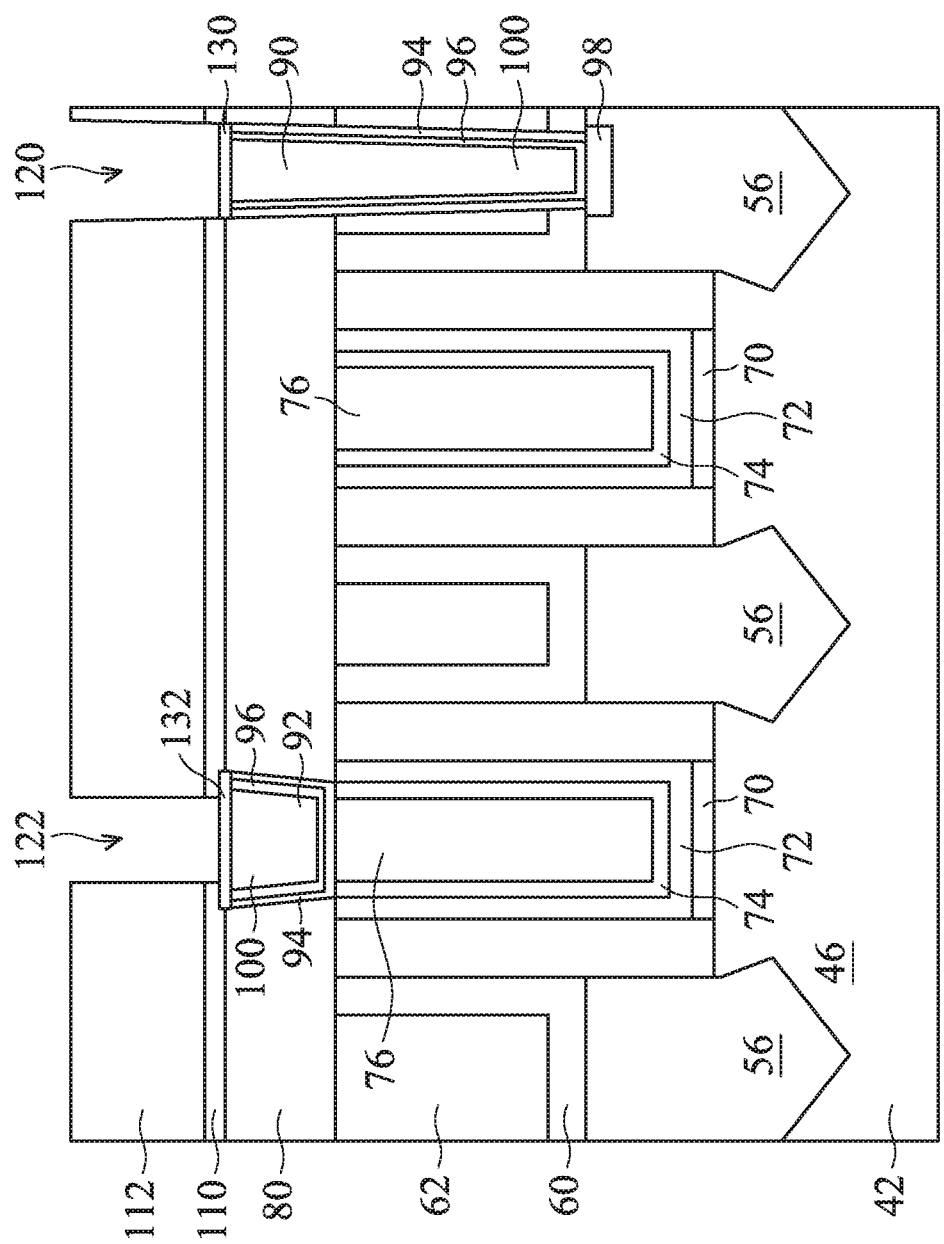

FIG. 17 illustrates the formation of openings 120 and 122 through the IMD 112 and ESL 110 to the blocking regions 130 and 132 on the conductive features 90 and 92, respectively. The formation of the openings 120 and 122 may be performed as described above with respect to FIG. 11, and hence, further description herein is omitted for brevity.

Figure 18:
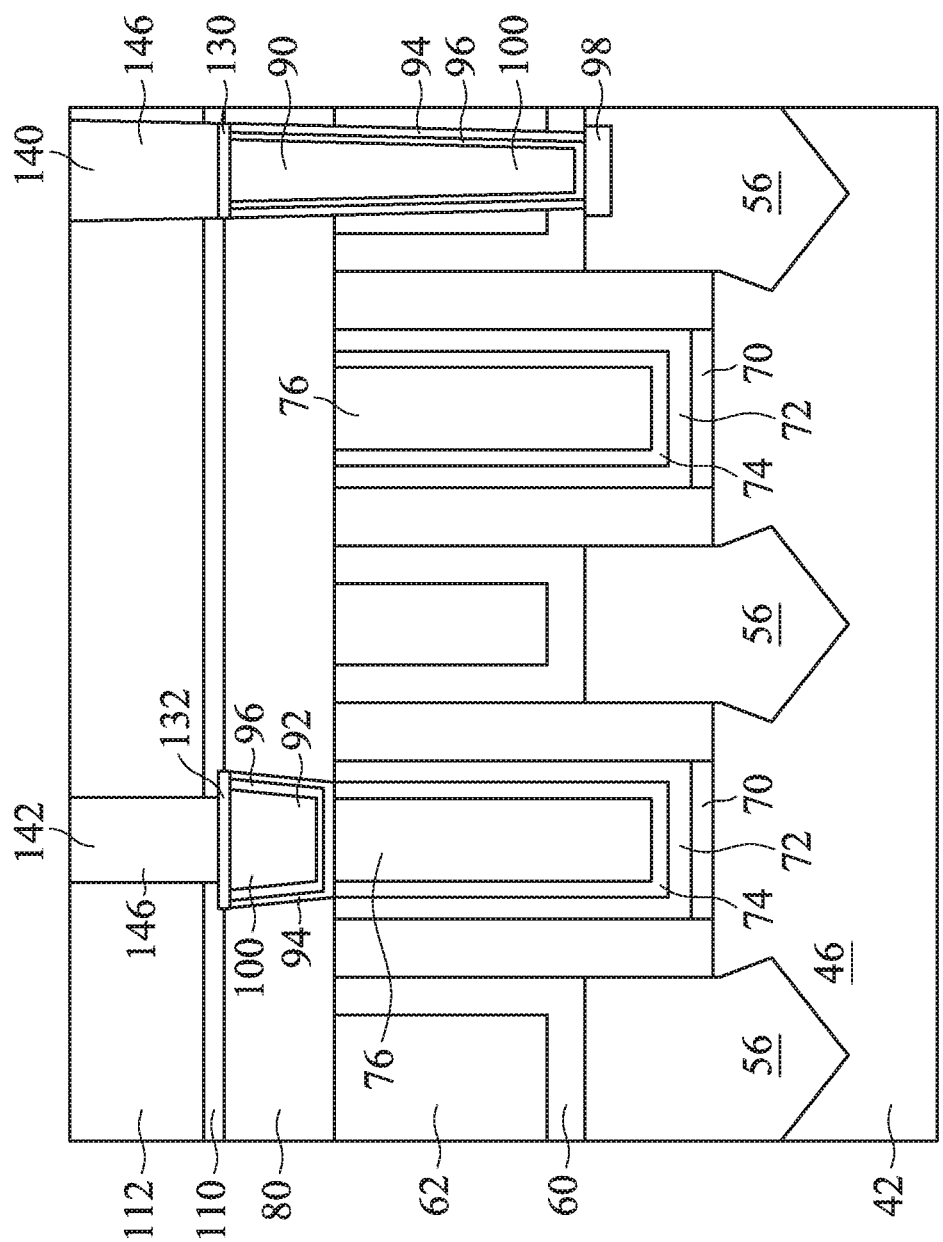

FIG. 18 illustrates the formation of conductive features 140 and 142 in the openings 120 and 122 to the blocking regions 130 and 132, respectively. The formation of the conductive features 140 and 142 may be performed as described above with respect to FIG. 13, and hence, further description herein is omitted for brevity. In this example, the conductive features 140 and 142 may not have lateral dimensions that are coextensive with corresponding lateral dimensions of the blocking regions 130 and 132, respectively. This may be because the blocking regions 130 and 132 are formed on entireties of the top surfaces of the conductive features 90 and 92 (e.g., before a dielectric layer is formed on the conductive features 90 and 92), and the subsequent formation of the conductive features 140 and 142 in the openings 120 and 122 may not necessarily be coextensive with the top surfaces of the conductive features 90 and 92, respectively.

Figure 19:
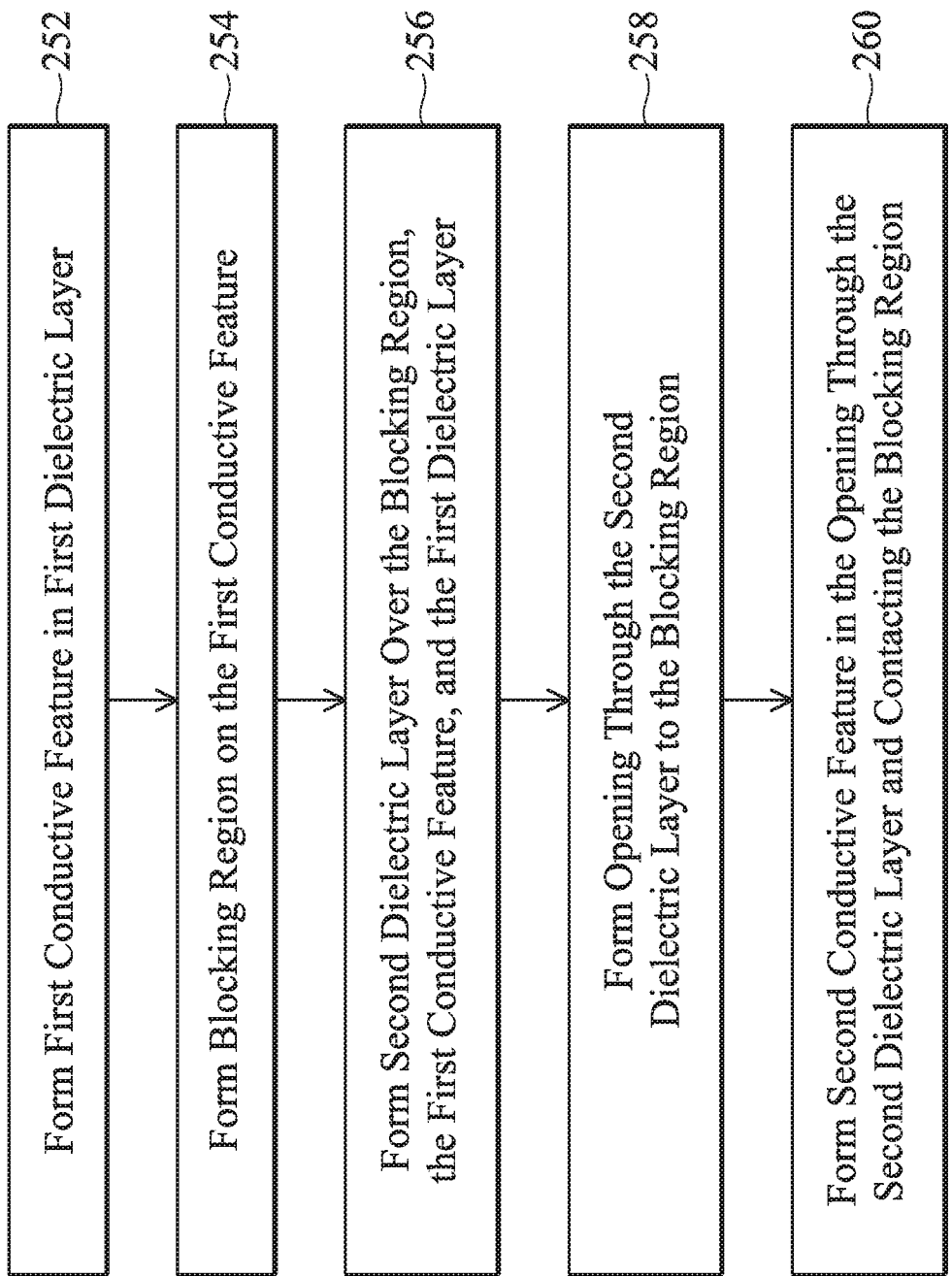
FIG. 19 is a flow chart of another example method for forming conductive features in accordance with some embodiments.

FIG. 19 is a flow chart of another example method for forming conductive features in accordance with some embodiments. In operation 252, a first conductive feature is formed in a first dielectric layer. An example of operation 252 is illustrated in and described with respect to FIGS. 8 and 9. For example, the conductive feature 90 is formed in the second ILD 80, the first ILD 62, and CESL 60.

In operation 254, a blocking region is formed on the first conductive feature. An example of operation 254 is illustrated in and described with respect to FIG. 15. For example, the blocking region 130 is formed on the conductive feature 90.

In operation 256, a second dielectric layer is formed over the blocking region, the first conductive feature, and the first dielectric layer. An example of operation 256 is illustrated in and described with respect to FIG. 16. For example, the ESL 110 and IMD 112 are formed over the blocking region 130, the conductive feature 90, and the second ILD 80, the first ILD 62, and CESL 60.

In operation 258, an opening is formed through the second dielectric layer to the blocking region. An example of operation 258 is illustrated in and described with respect to FIG. 17. For example, the opening 120 is formed through the ESL 110 and IMD 112 to the blocking region 130.

In operation 260, a second conductive feature is formed in the opening through the second dielectric layer and contacting the blocking region. An example of operation 260 is illustrated in and described with respect to FIG. 18. For example, the conductive feature 140 is formed in the opening 120 and contacting the blocking region 130.

Figure 20:
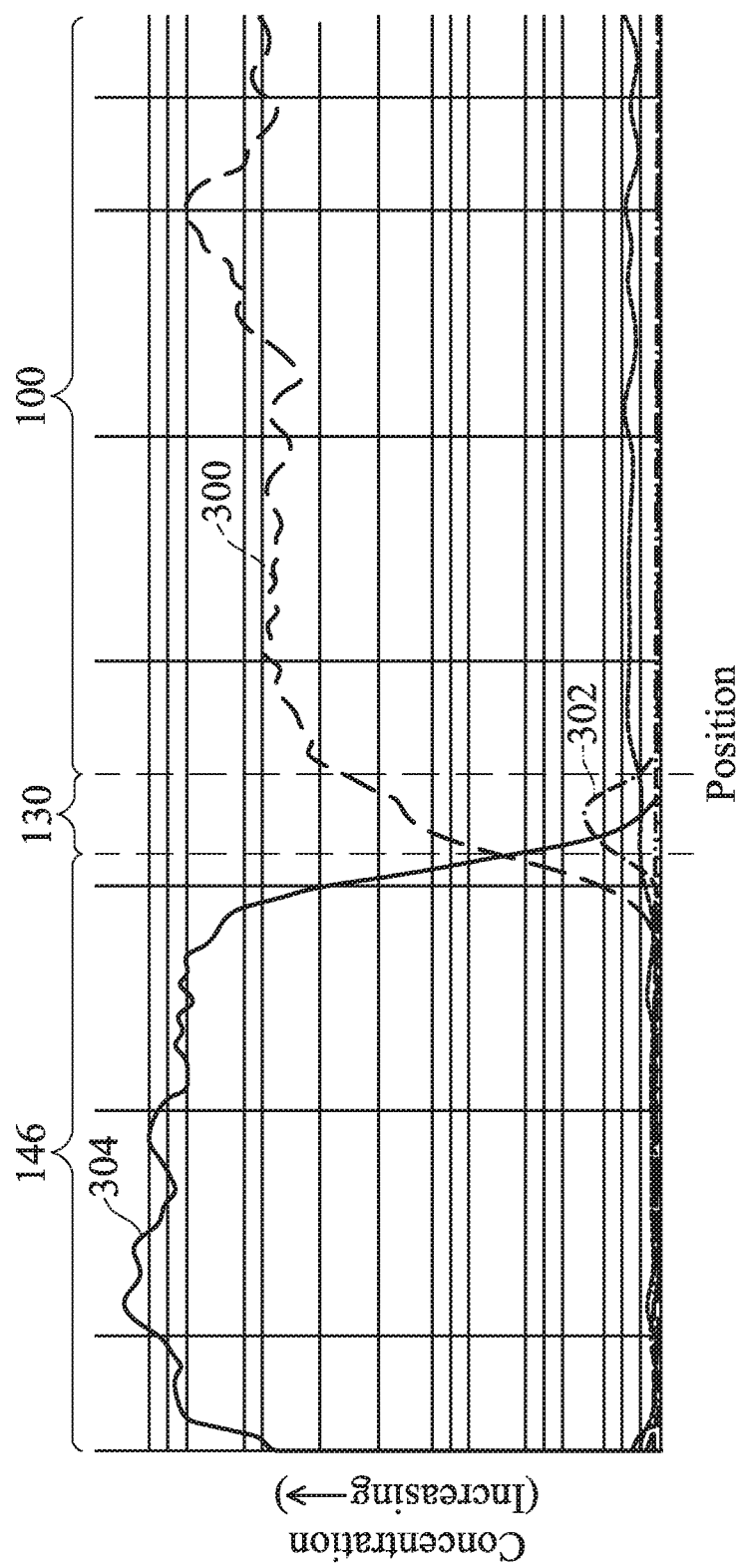
FIG. 20 is an energy-dispersive X-ray spectroscopy (EDX) analysis of an example structure in accordance with some embodiments.

FIG. 20 is an energy-dispersive X-ray spectroscopy (EDX) analysis of an example structure in accordance with some embodiments. The EDX analysis is across the conductive fill material 146 of the conductive feature 140, the blocking region 130, and the conductive fill material 100 of the conductive feature 90. The conductive fill material 100 is a first metal (e.g., cobalt), which has a first concentration profile 300. The species (e.g., silicon) implemented for forming the blocking region 130 has a second concentration profile 302. The conductive fill material 146 is a second metal (e.g., tungsten), which has a third concentration profile 304. As can be seen in the EDX analysis, the blocking region 130 comprises the species and the first metal (e.g., $CoSi_x$).

Some embodiments can achieve advantages. The planarization process (e.g., CMP) for removing, e.g., excess conductive fill material 146 and any subsequent wet cleaning can use wet chemicals that may be able to penetrate respective interfaces between the conductive features 140 and 142 and the IMD 112, particularly if adhesion between the IMD 112 and the conductive features 140 and 142 is poor, such as when no barrier and/or adhesion layer is implemented in the conductive features 140 and 142. If the wet chemicals penetrate to a sufficient depth, the wet chemicals may be able to reach and etch the underlying conductive features 90 and 92 in the absence of blocking layers. In some examples, such as provided herein, the blocking regions 130 and 132 can provide a different material composition that can act as an etch stop which may prevent the wet chemicals from etching the underlying conductive features 90 and 92. Further, in some implementations, the blocking regions 130 and 132 can provide improved adhesion between the underlying conductive features 90 and 92 and the IMD 112, such as when the blocking regions 130 and 132 are silicide. Even further, the blocking regions 130 and 132 can provide a more favorable surface for depositing the conductive fill material 146, such as when a selective deposition process is implemented for depositing the conductive fill material 146. This can improve pattern loading and can enhance film growth. Hence, the blocking regions 130 and 132 can provide a more robust structure.

An embodiment is a structure. The structure includes a first dielectric layer over a substrate, a first conductive feature in the first dielectric layer, a second dielectric layer over the first dielectric layer, a second conductive feature in the second dielectric layer, and a blocking region disposed between the first conductive feature and the second conductive feature. The second conductive feature is disposed between and abutting a first sidewall of the second dielectric layer and a second sidewall of the second dielectric layer. The blocking region extends laterally at least from the first sidewall of the second dielectric layer to the second sidewall of the second dielectric layer.

An embodiment is a method. A first conductive feature is formed in a first dielectric layer. A blocking region is formed on the first conductive feature by modifying a composition of the first conductive feature. A second conductive feature is formed in a second dielectric layer. The second dielectric layer is over the first dielectric layer. The second conductive feature contacts the blocking region.

Another embodiment is a structure. The structure includes a first dielectric over a substrate, a first conductive feature through the first dielectric, a blocking region on the first conductive feature, a second dielectric over the first dielectric, and a second conductive feature through the second dielectric and contacting the blocking region. The first conductive feature includes a first metal. The blocking region includes the first metal and a species. The blocking region is laterally coextensive with a bottom of the second conductive feature.

A further embodiment is a method. A first conductive feature is formed in a first dielectric. The first conductive feature includes a metal. A second dielectric is formed over the first conductive feature and the first dielectric. An opening is formed through the second dielectric to the first conductive feature. A blocking region is formed on the first conductive feature including providing a species through the opening and into the metal of the first conductive feature. A second conductive feature is formed in the opening and to the blocking region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack over a substrate;
   forming a first dielectric over the gate stack;
   forming a first conductive feature extending through the first dielectric to the gate stack, the first conductive feature comprising a metal;
   forming a second dielectric over the first conductive feature and the first dielectric;
   forming an opening through the second dielectric to the first conductive feature;
   forming a blocking region on the first conductive feature comprising providing a species through the opening and into the metal of the first conductive feature, the first conductive feature being wider than the blocking region at a top surface of the first conductive feature; and
   forming a second conductive feature in the opening and to the blocking region.

2. The method of claim 1, wherein providing the species through the opening and into the metal of the first conductive feature comprises exposing the metal to a gaseous chemical soak through the opening, wherein the species diffuses from a gas of the gaseous chemical soak into the metal.

3. The method of claim 1, wherein providing the species through the opening and into the metal of the first conductive feature comprises exposing the metal to a plasma treatment through the opening, wherein the species diffuses from a plasma of the plasma treatment into the metal.

4. The method of claim 1, wherein providing the species through the opening and into the metal of the first conductive feature comprises implanting the metal with the species.

5. The method of claim 1, wherein the species includes a silicon-containing species.

6. The method of claim 5, wherein the blocking region is a silicide.

7. A method comprising:
   forming a gate stack over a substrate;
   forming a first dielectric over the gate stack;
   forming a first conductive feature extending through the first dielectric to the gate stack, the first conductive feature comprising a metal;
   forming a second dielectric over the first conductive feature and the first dielectric;
   forming an opening through the second dielectric to the first conductive feature;
   forming a blocking region on the first conductive feature, the blocking region comprising MSx, wherein M is the metal, S is a species, and x is a concentration of the species, wherein the species comprises silicon, germanium, boron, arsenic, phosphorus, nitrogen, carbon, or tin, the blocking region having a topmost surface lower than a topmost surface of the second dielectric; and
   forming a second conductive feature in the opening, wherein the blocking region is interposed between the second conductive feature and the first conductive feature.

8. The method of claim 7, wherein the blocking region completely separates the first conductive feature and the second conductive feature.

9. The method of claim 7, wherein forming the blocking region is performed at least in part by a CVD process without plasma or a PECVD process.

10. The method of claim 7, wherein forming the blocking region is performed at least in part by implanting the species into the first conductive feature.

11. The method of claim 7, wherein the metal comprises cobalt, tungsten, copper, or ruthenium.

12. The method of claim 7, wherein a thickness of the blocking region is in a range from 3 nm to 5 nm.

13. The method of claim 7, wherein the species is a semiconductor, and wherein the concentration of the species is from 1 to 8.

14. A method comprising:
    forming a gate stack over a substrate;
    forming a first dielectric over the gate stack;
    forming a first conductive feature extending through the first dielectric to the gate stack, the first conductive feature comprising a metal;
    forming a second dielectric over the first conductive feature and the first dielectric;
    forming an opening through the second dielectric to expose an upper surface of the first conductive feature;
    forming a blocking region in the opening on the exposed upper surface of the first conductive feature, the blocking region comprising a metal-semiconductor compound, a metal-nonmetal compound, or a metal-metal compound, the blocking region comprising a compound of the metal, the first conductive feature being wider than the blocking region at a top surface of the first conductive feature, the sidewalls of the second dielectric layer in the opening being free of the blocking region; and
    forming a second conductive feature over the first conductive feature, wherein the blocking region is interposed between the second conductive feature and the first conductive feature.

15. The method of claim 14, wherein forming the blocking region is performed by diffusing a species into the first conductive feature.

16. The method of claim 15, wherein forming the blocking region comprises a chemical soak in silane.

17. The method of claim 16, wherein a ratio of a flow rate of silane to a ratio of a flow rate of a carrier gas is from 0.01 to 0.2.

18. The method of claim 14, wherein forming the blocking region comprises a direct plasma process.

19. The method of claim 7, wherein the blocking region is formed after the opening through the second dielectric.

20. The method of claim 1, wherein the blocking region has a topmost surface lower than a topmost surface of the second dielectric.

* * * * *